(12) United States Patent
Lin

(10) Patent No.: US 11,367,682 B2
(45) Date of Patent: Jun. 21, 2022

(54) VIAS AND GAPS IN SEMICONDUCTOR INTERCONNECTS

(71) Applicant: Intel Corporation, Santa Clara, CA (US)

(72) Inventor: Kevin Lin, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/329,738

(22) PCT Filed: Sep. 30, 2016

(86) PCT No.: PCT/US2016/054815
§ 371 (c)(1),
(2) Date: Feb. 28, 2019

(87) PCT Pub. No.: WO2018/063336
PCT Pub. Date: Apr. 5, 2018

(65) Prior Publication Data
US 2019/0214342 A1 Jul. 11, 2019

(51) Int. Cl.
*H01L 23/522* (2006.01)
*H01L 23/532* (2006.01)
*H01L 21/768* (2006.01)

(52) U.S. Cl.
CPC ...... *H01L 23/5226* (2013.01); *H01L 21/7682* (2013.01); *H01L 21/76885* (2013.01);
(Continued)

(58) Field of Classification Search
CPC ........... H01L 21/7682; H01L 21/76834; H01L 21/76885; H01L 23/5222; H01L 23/5226;
(Continued)

(56) References Cited

U.S. PATENT DOCUMENTS 7,772,706 B2   8/2010   Balakrishnan et al.
9,230,911 B2   1/2016   Tsai et al.
(Continued)

OTHER PUBLICATIONS

International Preliminary Report on Patentability from PCT/US2016/054815 dated Apr. 11, 2019, 9 pgs.
(Continued)

*Primary Examiner* — Matthew C Landau
*Assistant Examiner* — Dmitriy Yemelyanov
(74) *Attorney, Agent, or Firm* — Essential Patents Group, LLP

(57) ABSTRACT

This disclosure is directed to systems and methods for maskless gap integration in interconnects having one or more vias above one or more interconnect lines (for example, metal interconnect lines). In various embodiments, the systems and methods described in the disclosure may serve to reduce electrical shorting between adjacent vias in the interconnects. In one embodiment, a spacer layer may be provided to mask portions of an interlayer dielectric (ILD) in the interconnect. These masked portions of the ILD can protect regions between adjacent interconnect lines from electrical shorting during subsequent metal layer depositions in a fabrication sequence of the interconnects. Further, in various embodiments, the vias may enclose a gap (for example, an air gap) without the need for additional masking steps, for example, without the need for additional lithography steps.

14 Claims, 13 Drawing Sheets

(52) U.S. Cl.
CPC .. *H01L 23/53295* (2013.01); *H01L 21/76834* (2013.01); *H01L 23/5222* (2013.01); *H01L 23/53214* (2013.01); *H01L 23/53228* (2013.01)

(58) Field of Classification Search
CPC ......... H01L 23/53214; H01L 23/53228; H01L 23/53295; H01L 21/768; H01L 23/522; H01L 23/532
See application file for complete search history.

(56) References Cited

U.S. PATENT DOCUMENTS

| | | | | |
|---|---|---|---|---|
| 9,349,687 | B1* | 5/2016 | Gates | H01L 21/76834 |
| 9,390,965 | B2 | 7/2016 | Yang et al. | |
| 9,431,294 | B2 | 8/2016 | He et al. | |
| 9,613,851 | B2 | 4/2017 | Nitta et al. | |
| 2002/0043673 | A1* | 4/2002 | Tamaoka | H01L 21/76897 |
| | | | | 257/276 |
| 2007/0037380 | A1* | 2/2007 | Torres | H01L 21/7682 |
| | | | | 438/619 |
| 2009/0166881 | A1* | 7/2009 | Balakrishnan | H01L 23/53295 |
| | | | | 257/774 |
| 2014/0284813 | A1* | 9/2014 | Greco | H01L 21/31144 |
| | | | | 257/774 |
| 2015/0179499 | A1 | 6/2015 | Yang et al. | |
| 2015/0187696 | A1 | 7/2015 | Tsai et al. | |
| 2015/0287628 | A1* | 10/2015 | You | H01L 21/76837 |
| | | | | 257/774 |
| 2016/0035621 | A1 | 2/2016 | Chen et al. | |
| 2016/0118292 | A1 | 4/2016 | He et al. | |

OTHER PUBLICATIONS

International Search Report and Written Opinion for PCT Application No. PCT/US2016/054815, dated Jun. 27, 2017, 10 pages.
Office Action from Taiwan Patent Application No. 106127812 dated Dec. 21, 2020, 15 pgs.
Notice of Allowance from Taiwanese Patent Application No. 106127812 dated Jun. 23, 2021, 3 pgs.

* cited by examiner

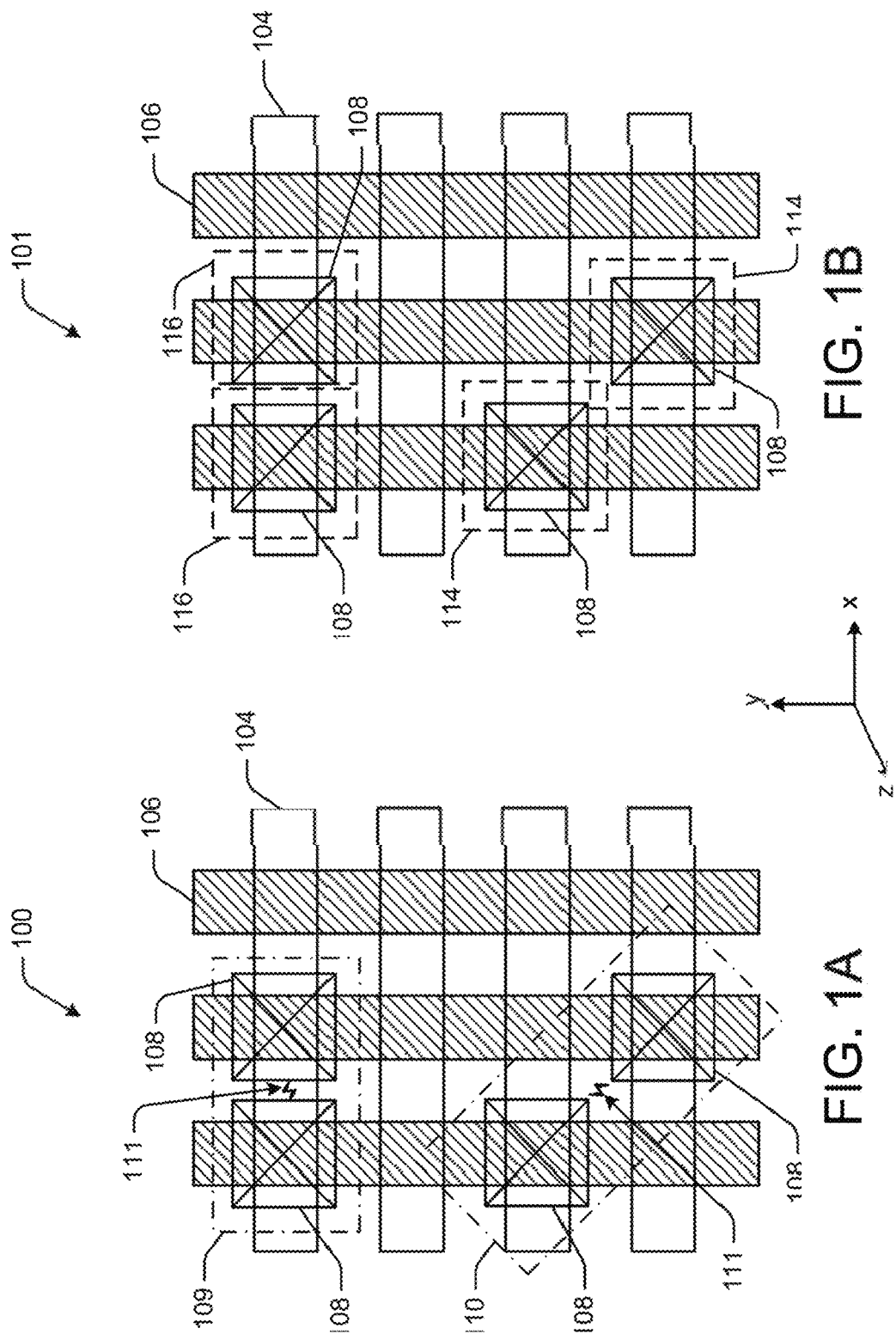

VIAS AND GAPS IN SEMICONDUCTOR INTERCONNECTS

CROSS-REFERENCE TO RELATED APPLICATION(S)

This application is a U.S. National Stage Application under 35 U.S.C. 371 and claims the priority benefit of PCT International Application No. PCT/US2016/054815, filed Sep. 30, 2016, the disclosure of which is incorporated herein by reference as if set forth in full.

TECHNICAL FIELD

This disclosure generally relates to interconnects, and more particularly to vias and gaps in semiconductor interconnects.

BACKGROUND

Integrated circuit(s) and other electronic devices may be integrated onto an electronic system, such as a consumer electronic system. The integrated circuit(s) and electronic devices may include any number of interconnects, including metallic signal traces which can serve to route signals.

BRIEF DESCRIPTION OF THE FIGURES

Reference will now be made to the accompanying drawings, which are not necessarily drawn to scale, and wherein:

FIGS. 1A-1B illustrates an example top down view of an example interconnect having vias in accordance with example embodiments of the disclosure.

DETAILED DESCRIPTION

Figure 2A:
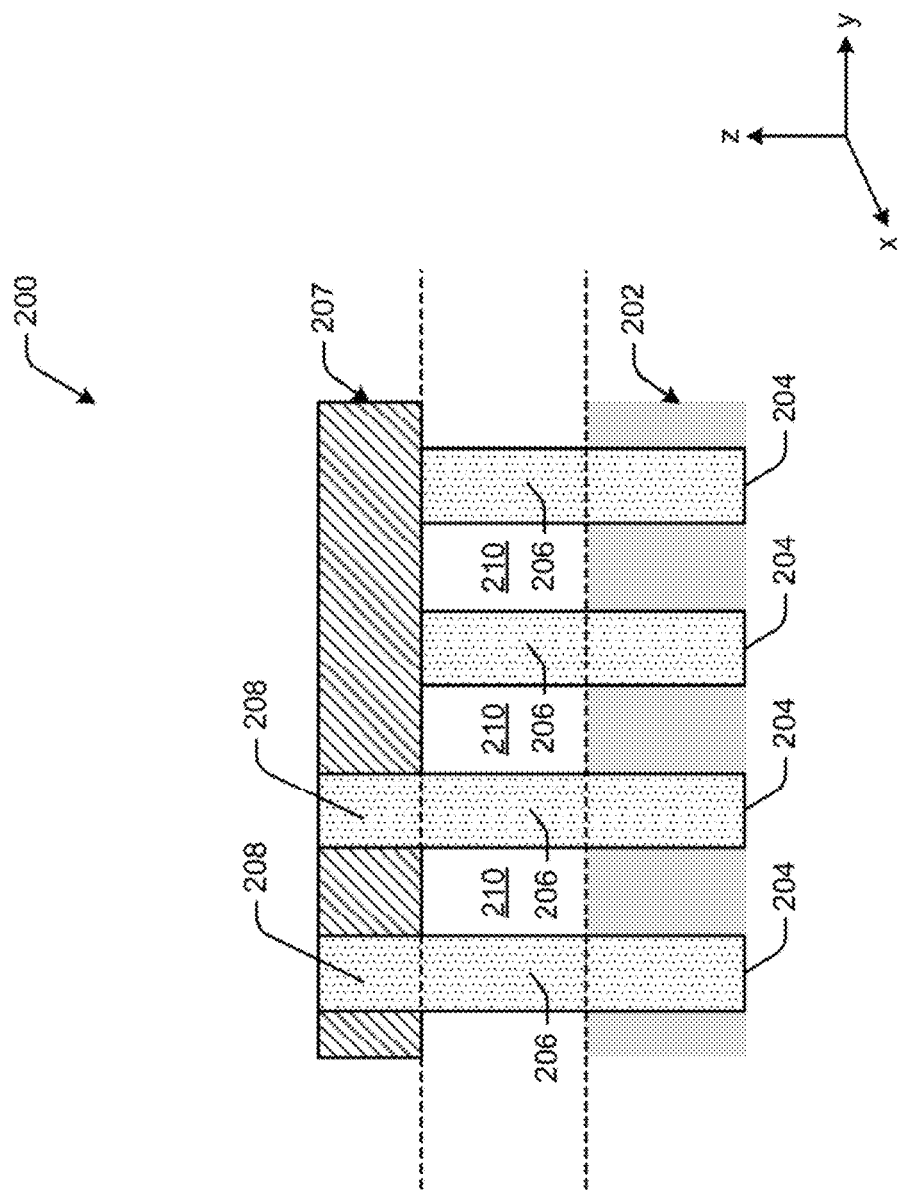
FIGS. 2A-2D illustrate an example process flow or the fabrication of the interconnects in accordance with one or more example embodiments of the disclosure.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (for example, surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to a horizontal plane, where the horizontal plane can include an x-y plane, a x-z plane, or a y-z plane, as the case may be. The term "processing" as used herein includes deposition of material or photoresist, patterning, exposure, development, etching, cleaning, ablating, polishing, and/or removal of the material or photoresist as required in forming a described structure.

In various embodiments of this disclosure, systems and methods described are directed to maskless gap (for example, air gap) integration into multilayer interconnects having one or more vias positioned above a portion of one or more interconnect interconnect lines (for example, metal interconnect interconnect lines) with respect to a plane defined by the wafer on which the interconnects are fabricated. In various embodiments, as described herein, a via (also referred to as vertical interconnect access) can be an electrical connection between layers in the interconnect that goes through a plane (for example, an x-y plane) of one or more adjacent layers. In various embodiments, the systems and methods described in the disclosure may serve to reduce electrical shorting between adjacent vias in the interconnects. In one embodiment, a spacer layer may be provided to mask portions of an interlayer dielectric (ILD) in the interconnect. These masked portions of the ILD can protect regions between adjacent interconnect interconnect lines (for example, metal interconnect interconnect lines) from electrical shorting during subsequent metal layer depositions during a fabrication sequence of the interconnects. Further, as will be described in more detail below, the vias may enclose a gap (for example, an air gap) without the need for additional masking steps. Such gaps may be inherently self-aligned to the vias and/or spacer layers (e.g., the gaps may have a predetermined offset between the gaps and the one or more vias and/or spacer layers). Moreover, the gaps may act to reduce capacitance and thereby increase performance (circuit timing, power consumption, etc.) of the interconnect.

In one embodiment, the interconnects can form a portion of a back-end interconnect, which can be part of a wafer (for example, silicon (Si)), one or more transistors and/or a backend interconnect structure). In one embodiment, the interconnects described herein can include multiple layers, for example, approximately 2 layers to approximately 100 layers. However, it may be appreciated that the systems and methods disclosed herein in connection with the interconnects may not be limited to any predetermined number of layers. In one embodiment, the layers of the interconnects may include metal layers, dielectric layers, interlayer dielectric layers and/or vias.

In various embodiments of the systems and methods of the disclosure, the vias may comprise approximately 5% to approximately 20% of the total area of the metal interconnect interconnect lines of the interconnects. The various embodiments disclosed herein can apply to approximately 14 nanometer processing technology. However it can be understood and appreciated that the disclosure can be used in connection with any other processing technology, for example, approximately 1 nanometer to approximately 1,000 nanometer processing technologies.

FIGS. 1A-1B illustrates a top-down view of example interconnects having vias in accordance with example embodiments of the disclosure. Although a two-layer interconnect 100 is shown in FIG. 1A, it can be understood and appreciated that the systems and methods disclosed herein can apply to a multilayer interconnect, for example, an N-layer interconnect, where N is any positive integer. The interconnect 100 can include a first interconnect interconnect line (for example, a metal interconnect interconnect line) 104 and a second interconnect interconnect line (for example, a metal interconnect interconnect line) 106. In one embodiment, the first interconnect interconnect line 104 may be positioned above the second interconnect interconnect line with reference to the Z-axis, though in other alternative embodiments, the second interconnect interconnect line may be positioned above the first interconnect interconnect line with reference to the Z-axis.

In one embodiment, the interconnect 100 can include one or more vias 108. A portion of these vias 108 may be adjacent to one another in the horizontal (or vertical) direction, for example, as shown in adjacent via group 109. In another example, a portion of these vias 108 may be adjacent to one another in the diagonal direction, as shown in adjacent vias group 110. One issue that may arise with the vias 108 of the interconnect 100 can be the formation of electrical shorts 111 in adjacent via groups, for example, adjacent via groups 109 and/or 110. The electrical shorts may occur as a result of at least two interconnect interconnect lines (for example, the first interconnect interconnect line 104 and the second interconnect interconnect line 106) making physical contact with one another as a result of or during one or more processing steps used in the formation of the interconnect 100. That is, various factors, including, but not limited to, inaccuracies in masking, and/or diffusion of metal during the processing steps may cause metal shorts to occur between adjacent interconnect interconnect lines at adjacent via group locations on the interconnect 100.

Furthermore, as will be described in more detail below, the vias, such as vias 108, may further enclose a gap (illustrated, for example, in FIGS. 2A-2D and FIGS. 3A-3G), for example, an air gap. Such gaps may act to reduce capacitance and thereby increase performance (for example, circuit timing, power consumption, and the like) of the interconnect. In various embodiments, the gaps may include an air gap but they may additionally include any other gas (for example, nitrogen, helium, hydrogen, xenon, inert gasses, and so on), liquids, and/or dielectrics (for example, low-K dielectrics). In one embodiment, such low-K dielectrics may be lower K with respect to underlying interlayer dielectric layers (IDLs).

FIG. 1B illustrates another top-down view of the example interconnect 101, further showing one or more masks that may be used in the fabrication of the interconnect 101, in accordance with one or more example embodiments of the disclosure. FIG. 1B illustrates the first interconnect interconnect line 104 and the second interconnect interconnect line 106, in addition to a plurality of vias 108. In one embodiment, adjacent vias (such as via group 109 and/or the vias group 110 as shown in FIG. 1A) may be protected from potential shorts (for example, such as the shorts described in connection with FIG. 1A) by using one or more masks, such as the mask 114 and mask 116. Thus, using masks 114 and/or 116 may represent another possible technique to reduce the occurrence of metal shorts.

FIGS. 2A-2D show example cross-sectional views of interconnects and illustrate example processing steps for the fabrication of interconnects in accordance with one or more example embodiments of the disclosure. In contrast with the top-down views of the interconnects 100 of FIG. 1B, FIGS. 2A-2D show simplified cross-sectional views of the interconnects. In various embodiments, the simplified cross-sectional views of the interconnects shown in FIGS. 2A-2D can form a part of a wafer (for example, a silicon (Si) wafer), one or more transistors, and/or backend interconnects structure, and the structures shown in FIGS. 2A-2D can represent merely a portion of the interconnect. It can be understood that the structure can be repeated in the x and/or y direction (with respect to the axis drawn) to produce a periodic (or semi-periodic structure).

FIG. 2A illustrates an example simplified cross-sectional view of an intermediate structure in an illustrative processing sequence for the fabrication of a portion of the interconnect 100 and/or 101 of FIG. 1B. In one embodiment, an interconnect 200 can include a first interlayer dielectric (ILD) 202. The first ILD layer 202 may be a permanent and/or a non-conformal dielectric layer. The first ILD layer 202 may be deposited via any suitable mechanism, including but not limited to, chemical vapor deposition (CVD), physical evaporation chemical vapor deposition (PECVD) and/or by spin coating.

The interconnect 200 may further include a plurality of interconnect interconnect lines (for example, metal interconnect interconnect lines) 204. In one embodiment, the plurality of interconnect interconnect lines 204 may be similar, but not identical, to a portion of the first interconnect interconnect line 104 and/or the second interconnect interconnect line 106 of FIG. 1B. The interconnect 200 can further include a first metal portion 206. The first metal portion 206 can include a portion of a interconnect interconnect line (for example, a metal interconnect interconnect line) 204 above the first ILD layer 202 and below a second ILD layer 207 with respect to the Z-axis. Further the metal interconnect interconnect line 204 can include various portions: a portion of the metal interconnect interconnect line 204 can be embedded with the first ILD layer 202; a portion of the metal interconnect interconnect line can be at least partially embedded in a second ILD layer 207; and a portion of metal interconnect interconnect line 204 (e.g., the first metal portion 206) can serve to connect the two portions embedded in the first ILD layer 202 and the second ILD layer 207. In various embodiments, the second ILD layer 207 can be backfilled, as will be shown and discussed below in connection with further embodiments.

The interconnect 200 can further include a plurality of vias 208. The vias 208 can, in various embodiments, include a portion of the interconnect interconnect line (for example, metal interconnect interconnect line) 204 above the first metal portion 206. Further, the via may be positioned in the second ILD layer 207. In various embodiments, the vias 208 can comprise the same material as the interconnect interconnect line (for example, metal interconnect interconnect line) 204. The interconnect 200 can further include one or more gaps 210 disposed between adjacent first metal portions 206. The gaps 210 can include, for example, an air gap, but can include a gap filled with any other suitable gas, dielectric, and/or liquid. As mentioned, in various embodiments, the presence of the gap 210 can reduce the capacitance and thereby increase the performance of the interconnect 200.

Figure 2B:
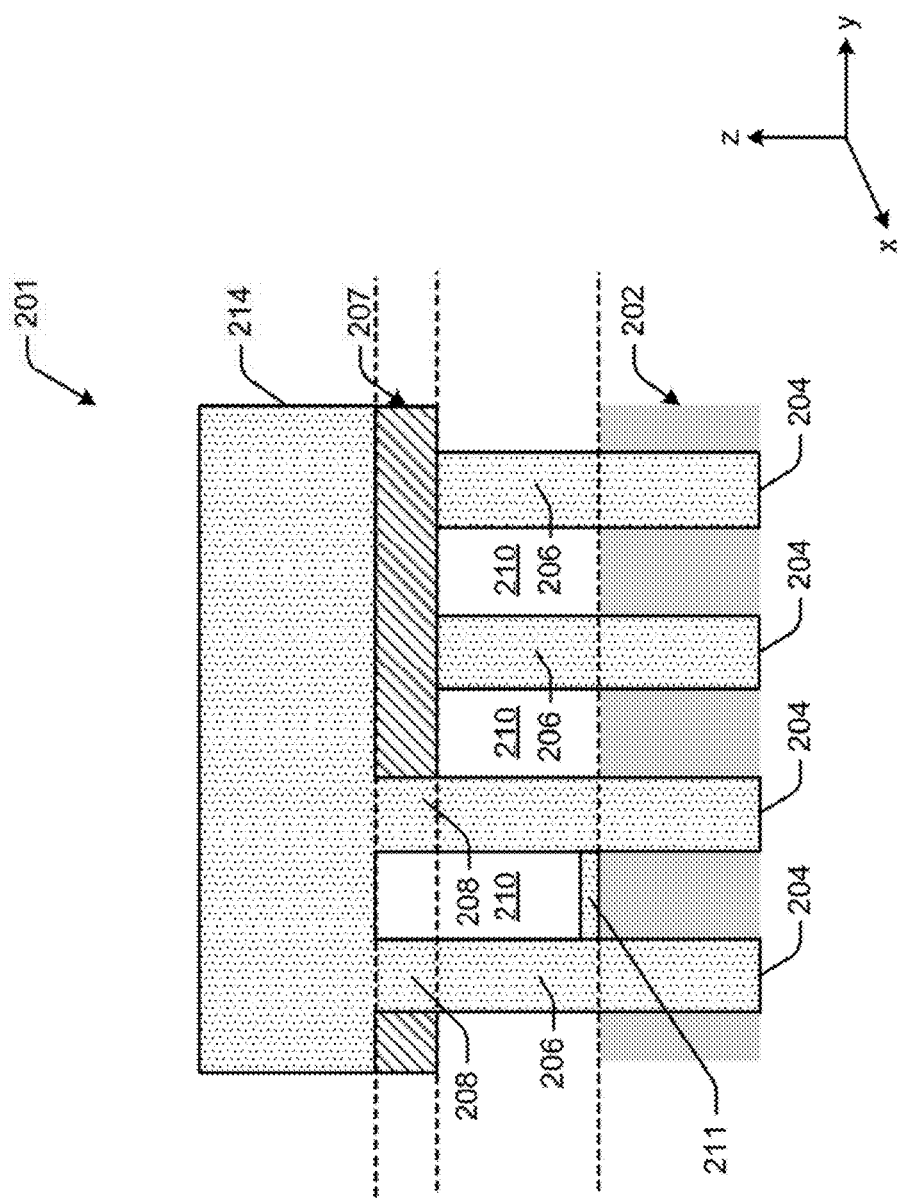

FIG. 2B illustrates another example, simplified cross-sectional view of an intermediate structure in an illustrative processing sequence for the fabrication of a portion of the example interconnect shown in FIG. 1B after the deposition of a second metal layer 214 on the interconnect. This interconnect 201 can be part of a wafer (for example, Si)/one or more transistors/backend interconnect structure, in accordance with various embodiments.

The interconnect 201 can include a first ILD layer 202. The interconnect 201 can further include a plurality of interconnect lines (for example, metal interconnect lines) 204. The plurality of interconnect lines 204 may be similar, but not identical, to a portion of the first interconnect lines 104 and/or the second interconnect lines 106 of FIG. 1A and/or FIG. 1B. The interconnect lines 204 can further include first metal portions 206 of the interconnect lines 204. The first metal portion 206 can be positioned above the first ILD layer 202 and below a second ILD layer 207, for example, with respect to a Z-axis. In one embodiment, the interconnect 201 can include one or more gaps 210. In particular the formation of the second ILD layer 207 on a portion of the interconnect lines 204 can serve form a spatial relationship between adjacent interconnect lines 204 the one or more gaps 210. The gap 210 can include a gas (for example, air), liquid, a dielectric material or any other suitable material.

In various embodiments, the second ILD layer 207 can include a backfilled ILD. The interconnect 201 can further include a plurality of vias 208. The vias can, in various embodiments, include a portion of the interconnect line (for example, metal interconnect line) 204 above the first metal portion 206. The interconnect 201 can further include the second metal layer 214. The second metal layer 214 may be formed by any suitable method, including chemical vapor deposition (CVD) and/or a plasma-enhanced chemical vapor deposition (PECVD), and/or physical vapor deposition (PVD), and/or electroplating.

The formation of the second metal layer 214 may lead to the formation of one or more electrical shorts 211, which is undesirable. The shorts 211 can result from a connection between two adjacent interconnect lines of the plurality of interconnect lines 204. The formation of the short can be detrimental to the performance of interconnects, for example, by preventing the transmission of various electronic signals between one or more transistors of a chip and/or die that makes use of the interconnect. Accordingly, the systems and methods described herein are example embodiments that are directed towards the prevention of the formation of such shorts, for example, by using a spacer layer or partial layer (discussed below) to provide additional ILD material between adjacent interconnect lines and thereby physically impede the formation of the shorts.

Figure 2C:
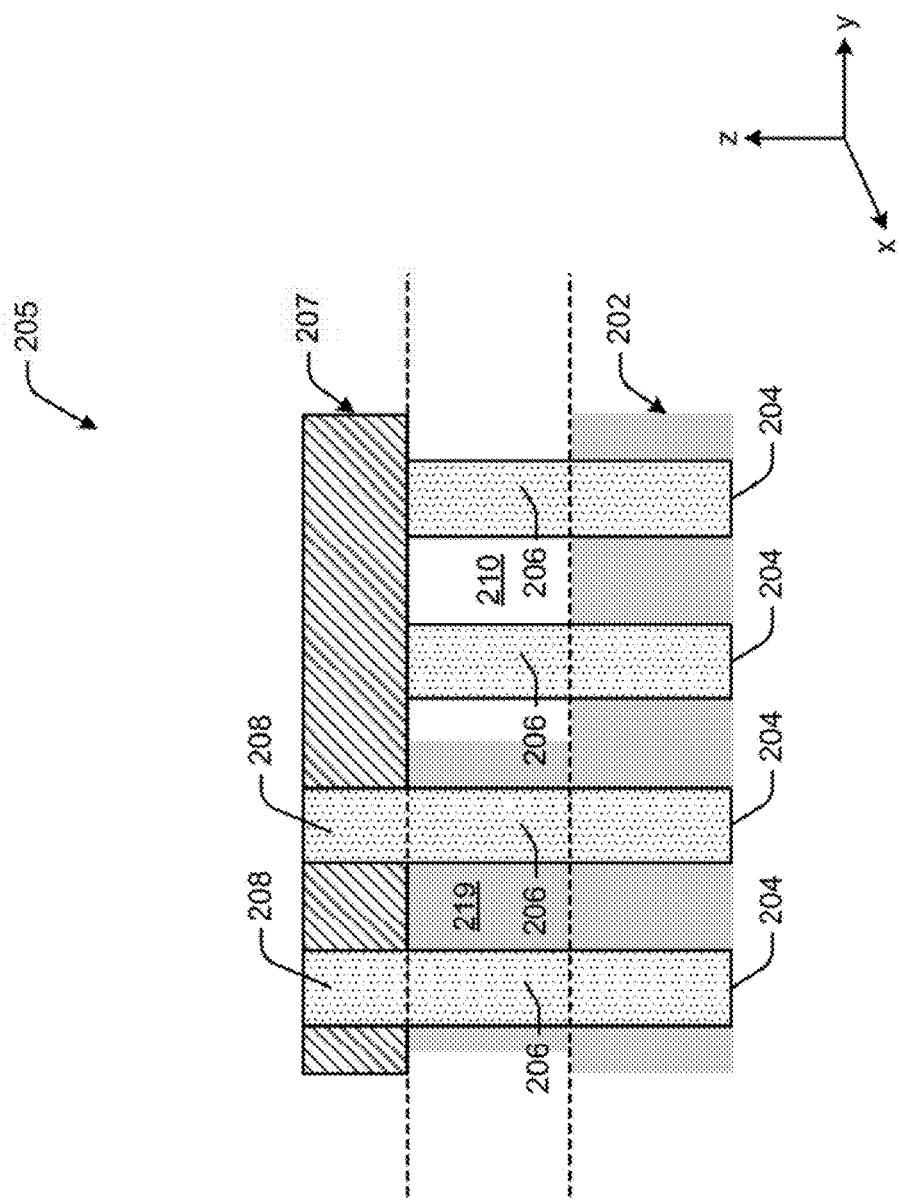
Figure 2D:
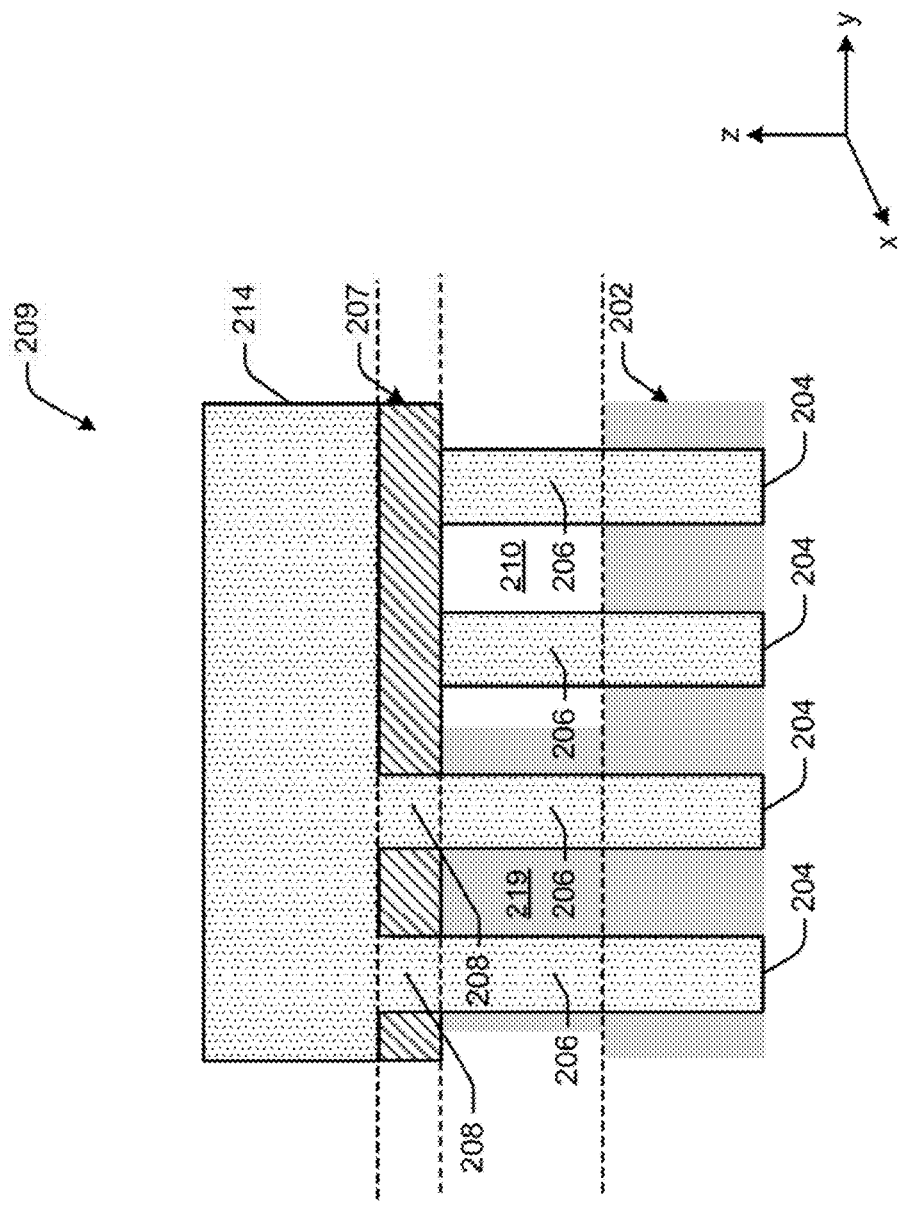

FIGS. 2C-2D show an example method of using masks to reduce the risk of forming an electrical short between the interconnects, as shown and described in connection with FIG. 1A-2B in accordance with various embodiments of the disclosure.

FIG. 2C illustrates an example simplified cross-sectional view of an intermediate structure of a processing sequence for the fabrication of a portion of the example interconnect shown in FIG. 1B. In various embodiments, the interconnect 205 can form a part of a wafer (silicon)/one or more transistors/a backend interconnect structure. In one embodiment, the interconnect 205 can further include a first ILD layer 202. The interconnect 205 can further include a second ILD layer 207. In one embodiment, the second ILD layer 207 may include a backfilled ILD. The interconnect 205 can further include a plurality of interconnect lines (for example, metal interconnect lines) 204. In one embodiment, the plurality of interconnect lines 204 may be similar, but not identical, to a portion of the first interconnect lines 104 and/or second interconnect lines 106 of FIG. 1B.

In one embodiment, the interconnect 205 can further include a first metal portion 206. In particular, the metal interconnect line 204 can include various portions: a portion of the metal interconnect line 204 can be embedded with the first ILD layer 202; a portion of the metal interconnect line can be at least partially embedded in a second ILD layer 207; and a portion of metal interconnect line 204 (e.g., the first metal portion 206) can serve to connect the two portions embedded in the first ILD layer 202 and the second ILD layer 207. Thus, the first metal portion 206 can include a portion of a interconnect line (for example, a metal interconnect line) 204 above the first ILD layer 202 and below the second ILD layer 207 with respect to the Z-axis. The interconnect can further include one or more vias 208. The vias 208 can, in various embodiments, include a portion of the interconnect line (for example, metal interconnect line) 204 above the first metal portion 206. Further, the vias 208 may be positioned in the second ILD layer 207. In various embodiments, the vias 208 can comprise the same material as the interconnect line (for example, metal interconnect line) 204 from which it is made.

Further, in various embodiments, a first portion 219 of the first ILD layer 202 may be formed by one or more masks (not shown) and one or more etching steps that may etch a portion of the first ILD layer 202 to create gaps 210, but leave behind the first portion 219 (to be discussed further below in connection with FIG. 3). The first portion 219 of the first ILD layer 202 may be used to reduce the risk of electrical shorts resulting during the formation of metal layers (for example, the second metal layer 214 of FIG. 2B), as further described in connection with FIG. 2D below. In particular, the first portion 219 of the first ILD layer 202 can act as a buffer material between the adjacent interconnect lines 204 of the interconnect, and physically impede the interconnect lines from making electrical contact with one another upon the deposition of a metal layer (for example, the metal layer 214 shown and discussed below in connection with FIG. 2D) in a future processing step. The first portion 219 may completely fill the space between adjacent interconnect lines 204, or may partially fill the space between adjacent interconnect lines 204.

FIG. 2D illustrates an example simplified cross-sectional view of an intermediate structure a processing sequence for the fabrication of a portion of the example interconnect shown in FIG. 1B. In particular, FIG. 2D illustrates the additional formation of a second metal layer 214 on the second ILD layer 207, thereby making electrical contact with the one or more vias 208 that can be embedded in the second ILD layer 207. In one embodiment, the interconnect 209 can be formed as a part of a wafer (for example, Si)/one or more transistors/backend interconnects. In one embodiment, the interconnect 209 can include a first ILD layer 202. The interconnect 209 may further include a plurality of interconnect lines 204 (for example, metal interconnect lines). The plurality of interconnect lines 204 may be similar, but not necessarily identical to, a portion of the first interconnect lines 104 and/or a second interconnect line 106 of FIG. 1B.

In one embodiment, the interconnect 209 can further include a first metal portion 206. In particular, the metal interconnect line 204 can include various portions: a portion of the metal interconnect line 204 can be embedded with the first ILD layer 202; a portion of the metal interconnect line can be at least partially embedded in a second ILD layer 207; and a portion of metal interconnect line 204 (e.g., the first metal portion 206) can serve to connect the two portions embedded in the first ILD layer 202 and the second ILD layer 207. The first metal portion 206 can include a portion of a interconnect line (for example, metal interconnect line) above the first ILD layer 202 and below the second ILD layer with respect to the Z-axis. In one embodiment, the second ILD layer 207 can include a backfilled ILD. The interconnect 209 can further include one or more vias 208. The vias 208 can, in various embodiments, include a portion of the interconnect line (for example, metal interconnect line) 204 above the first metal portion 206.

The interconnect 209 further includes a second metal layer 214 on the second ILD layer 207, thereby making electrical contact with the one or more vias 208 that can be embedded in the second ILD layer 207. The second metal layer 214 can be deposited using any suitable method (such as plasma enhanced chemical vapor deposition (PECVD), chemical vapor deposition (CVD), spin-on processes, spray coating processes, physical vapor deposition (PVD), combinations thereof, or the like.

In one embodiment, the interconnect 209 can further include a first portion 219 of the first ILD layer 202, resulting from the application of a mask (not shown). The first portion of the first ILD layer 202 can thereby reduce the risk of electrical shorts (for example, the shorts 211 of FIG. 2B) while allowing the presence of one or more gaps 210. The formation of shorts between adjacent interconnect lines having vias 208 is reduced, if not removed in an interconnect having the first portion 219 of the first ILD layer 202, as compared to an interconnect without the first portion 219 of the first ILD layer 202 (such as that shown in FIG. 2B) where adjacent interconnect lines 204 would only have air (or similar medium) between them. This can lead to a situation where, during the deposition of the second metal layer 214, a portion of the second metal layer 214 can electrically connect (that is, short) the adjacent interconnect lines 204. This may even occur subsequent to the deposition of the second metal layer 214, for example, through diffusion mechanisms and metal migration that may cause the adjacent interconnect lines 204 to electrically connect. In one embodiment, the gaps 210 between adjacent interconnect lines 204 can still exist in the interconnect, for example, in regions that are not as susceptible to short formation (for example, because they are masked and protected by the second ILD layer 207). Further, the gaps 210 can include, for example, an air gap, but can alternatively include a gap filled with any other suitable gas, dielectric, and/or liquid. As mentioned, in various embodiments, the presence of the gap 210 can reduce the capacitance and thereby increase the performance of the interconnect 209. In some embodiments, the first portion 219 of the first ILD layer 202 may extend partially past two adjacent interconnect lines and into a gap, yielding a partial gap (to be discussed further below). This may be a mere result of inherent misalignments in one or more processing steps, which may or may not be intentionally generated.

FIGS. 3A-3G show an example process flow for the fabrication of an interconnect in accordance with example embodiments of the disclosure. In the example processing sequence depicted in connection with FIGS. 3A-3G, a backfilled ILD (such as the backfilled ILD of FIGS. 2A-2D) may be replaced with the deposition of a non-conformal ILD, resulting in a gap, for example, an air gap. The gap can include, for example, an air gap but can include a gap filled with any other suitable gas, dielectric, and/or liquid. As mentioned, in various embodiments, the presence of the gaps can reduce the capacitance and thereby increase the performance of the interconnect. The structures shown in FIGS. 3A-3G can represent a portion of the interconnect. It can be understood that the structure can be repeated in the x and/or y direction (with respect to the axis drawn) to produce a periodic (or semi-periodic structure).

Figure 3A:
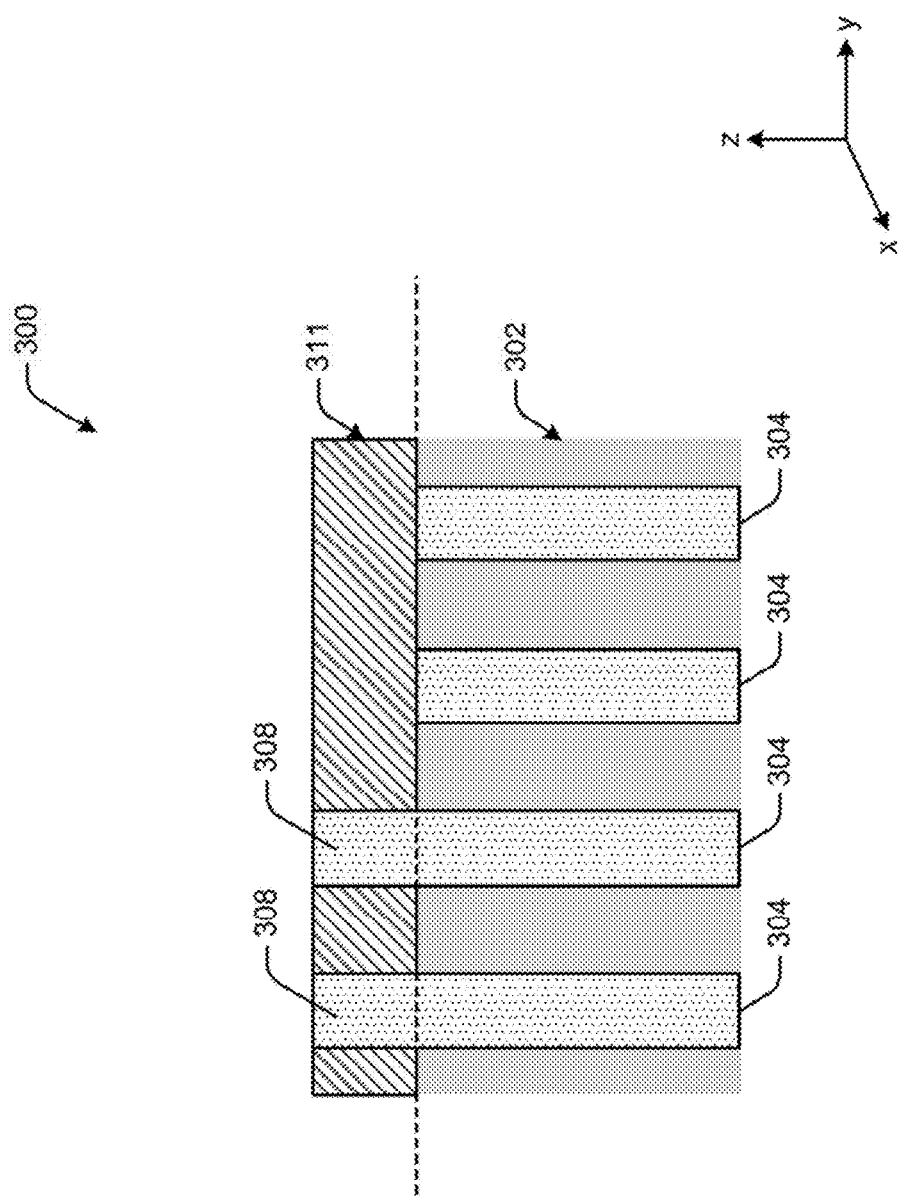
FIGS. 3A-3G illustrate another example process flow for the fabrication of an interconnect in accordance with example embodiments of the disclosure.

FIG. 3A illustrates an example diagram of a portion of an interconnect structure, the portion of the interconnect representing a structure fabricated during upstream fabrication. In one embodiment, the portion of the interconnect 300 can include a first ILD layer 302. The first ILD layer 302 may be a permanent and/or a non-conformal dielectric layer. The first ILD layer 302 may be deposited via any suitable mechanism, including but not limited to, chemical vapor deposition (CVD), plasma enhanced chemical vapor deposition (PECVD) and/or by spin coating. The first ILD layer 302 may be any suitable thickness. For example, the first ILD layer 302 may be approximately 5 nanometers to approximately 1,000 nanometers thick with a preferred range of approximately 30 nanometers to approximately 60 nanometers thick.

In one embodiment, the interconnect 300 can further include a plurality of interconnect lines (for example, metal interconnect lines) 304. In one embodiment, the interconnect 300 can further include a hard mask layer 311, which may be a sacrificial layer. One or more vias 308 may be disposed in the hard mask layer 311, and positioned above the metal interconnect lines 304. In one embodiment, the hard mask layer 311 may be a conductive or a non-conductive layer. In another embodiment, the hard mask layer 311 can include any suitable material, for example, amorphous silicon, any metal oxide, silicon nitride (SiN), titanium nitride (TiN), and/or titanium (Ti).

In one embodiment, the hard mask layer 311 may be deposited by any suitable mechanism, including but not limited to CVD, PVD, electroplating, and/or PECVD. The hard mask layer 311 can have a thickness of approximately 5 nanometers to approximately 1,000 nanometers with a preferred range of approximately 10 nanometers to approximately 30 nanometers thick.

Figure 3B:
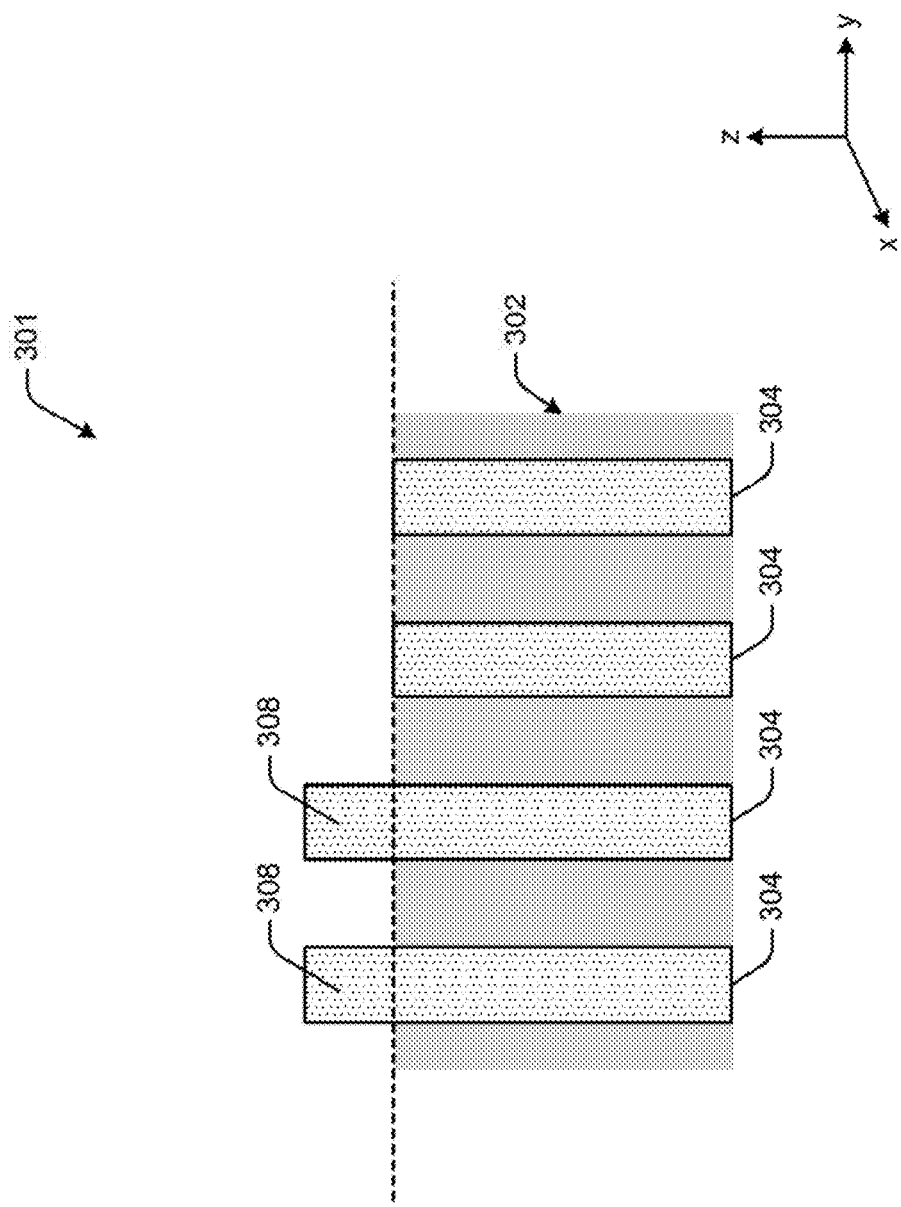

FIG. 3B illustrates an example simplified cross-sectional view of an intermediate structure a processing sequence step for the formation of a portion of the interconnect in accordance with one or more example embodiments of the disclosure.

In particular, in one embodiment, the interconnect 301 can include a first ILD layer 302, a plurality of interconnect lines 304, and a plurality of vias 308. The plurality of interconnect lines 304 may include, for example, a plurality of metal interconnect lines. In one embodiment, the first ILD layer 302 may include a permanent and/or a non-conformal layer. The first ILD layer 302 may be deposited using CVD, PECVD, and/or spin coating or any suitable technique. The first ILD layer 302 can have a thickness of approximately 5 nanometers to approximately 1,000 nanometers with a preferred range of approximately 30 nanometers to approximately 60 nanometers thick.

Further, the interconnect 301 depicted in FIG. 3B has had the hard mask layer 311 of FIG. 3A removed. In one embodiment, the hard mask layer 311 can be removed by an etching process. In one embodiment, the etching process can include, for example, a dry etch. In one embodiment, the dry etch can include, for example, a plasma-based and/or a mechanical-based etch. In another embodiment, the hard mask layer 311 can be removed by a wet etch. The wet etching process can include, for example, any suitable chemicals for the removal of the hard mask layer 311. For example, for a hard mask layer 311 comprising silicon dioxide, $SiO_2$, a hydrofluoric acid based wet etch may be used. In another embodiment for a hard mask layer 311 comprising titanium nitride, TiN, a hydroxide-based wet etch may be used.

Figure 3C:
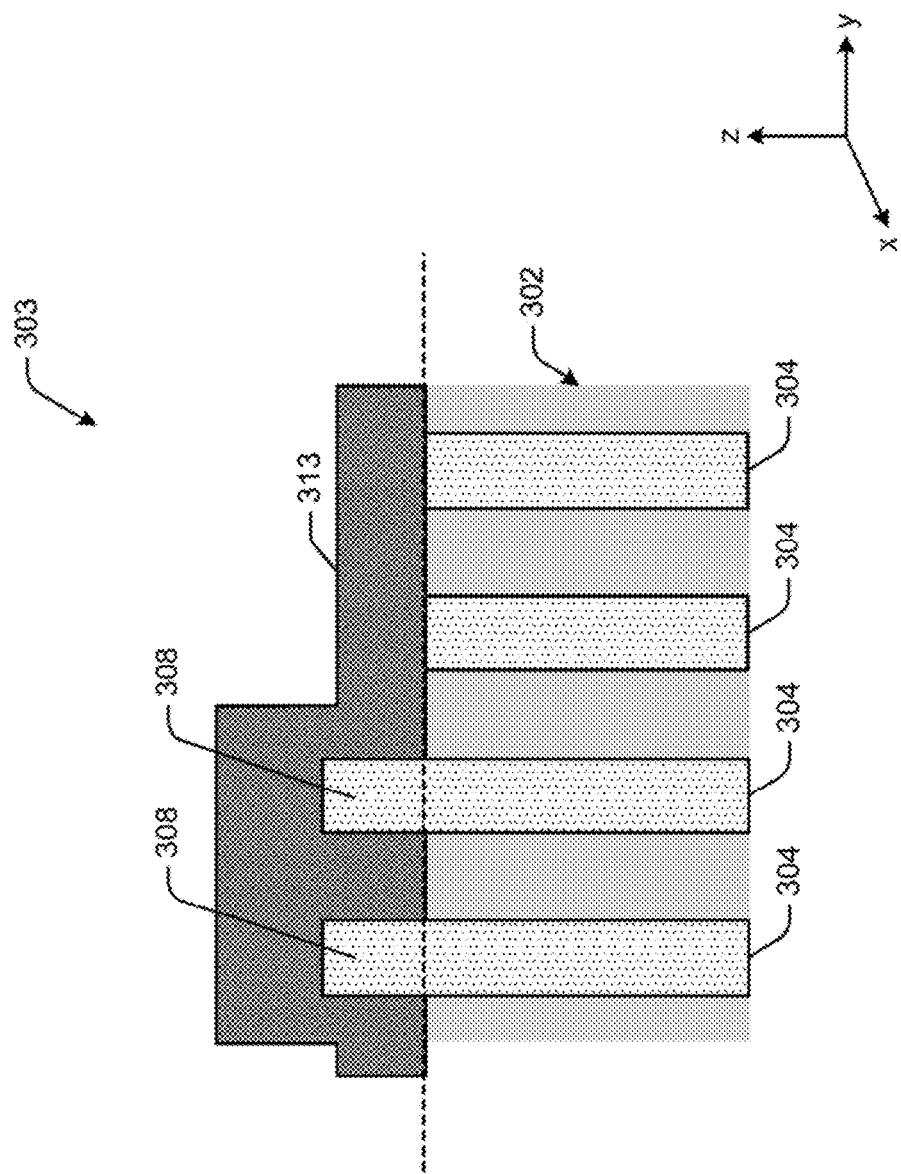

FIG. 3C illustrates an example simplified cross-sectional view of an intermediate structure a processing sequence step for the formation of the interconnect in accordance with one or more example embodiments of the disclosure. In particular, the interconnect 303 can include a first ILD layer 302, a plurality of interconnect lines 304, and a plurality of vias 308. The plurality of interconnect lines 304 may include, for example, a plurality of metal interconnect lines. The plurality of interconnect lines 304, may be similar to, but not identical to, a portion of the first interconnect lines 104 and/or the second interconnect lines 106 of FIG. 1A and/or FIG. 1B.

In one embodiment, the first ILD layer 302 may include a permanent and/or a non-conformal layer. The first ILD layer 302 may be deposited using CVD, PECVD, and/or spin coating or any suitable technique. The first ILD layer 302 can have a thickness of approximately 5 nanometers to approximately 1,000 nanometers with a preferred range of approximately 30 nanometers to approximately 60 nanometers thick.

Further, in one embodiment, the interconnect 303, may be similar to FIG. 3A, but additionally have a spacer layer 313 disposed on the first ILD layer 302, the vias 308, and a portion of the interconnect lines 304. In one embodiment, the spacer layer 313 can be non-conductive. In another embodiment, the spacer layer 313 may be permanent (that is, non-sacrificial). In one embodiment, the spacer layer 313 may be etch selective to the ILD 302. In an embodiment, the spacer layer 313 may be deposited by CVD, PECVD, atomic layer deposition (ALD), and/or any other suitable technique needing conformal deposition.

In one embodiment, the spacer layer 313 may have a thickness greater than or equal to approximately one half the thickness of the spacing between adjacent interconnect lines of the plurality of interconnect lines 304. In an embodiment, the spacer layer 313 may include a metal oxide. In another embodiment, the spacer layer 313 and may be conformal to facilitate deposition around the tight-pitch topography of the underlying layers.

Figure 3D:
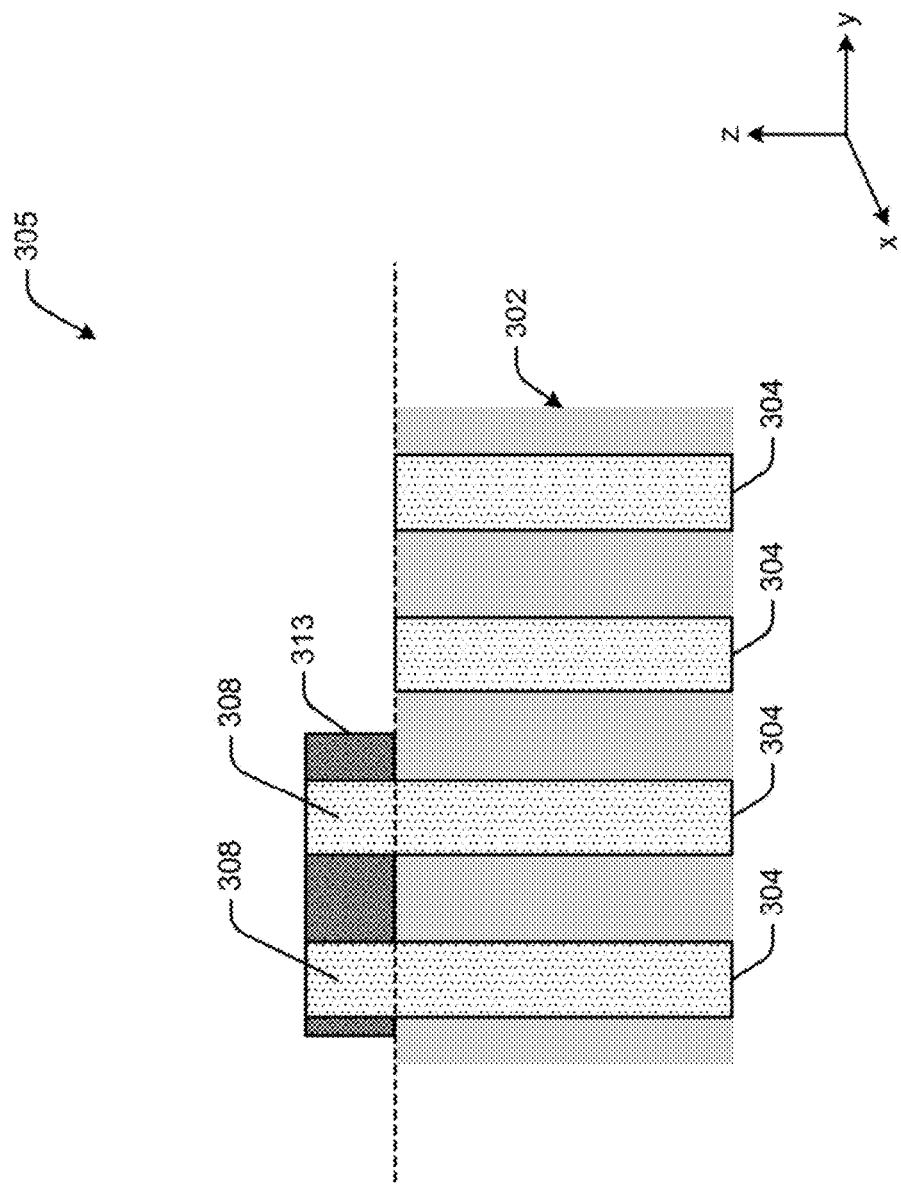

FIG. 3D illustrates an example simplified cross-sectional view of an intermediate structure a processing sequence step for the formation of a portion of the interconnect, in accordance with one or more example embodiments of the disclosure.

In particular, the interconnect 305 of FIG. 3D may be similar, but not necessarily identical, to the interconnect 303 of FIG. 3C, except that the spacer layer 313 has been partially etched to remove the portions of the spacer layer 313, for example, in unmasked regions of the spacer layer 313. The spacer layer 313 allows for the masking of regions of the first ILD layer 302 (for example, regions encompassing the first portion 303 of the first ILD layer 302 of FIGS. 3D-3G) that can act as a buffer material between the adjacent interconnect lines 204 of the interconnect that include vias 308 and physically impede the interconnect lines from making electrical contact with one another upon the deposition of a metal layer (for example, the metal layer 214 shown and discussed below in connection with FIG. 2D) in a future processing step. Additionally, the spacer layer 313 does not additionally cover the one or more vias 308, thereby allowing the one or more vias 308 to electrically contact a second metal layer (for example, a second metal layer 324 as shown and described in connection with FIG. 3G). In one embodiment, the spacer layer 313 is sized so as to allow for the formation of one or more gaps (for example, one or more gaps 310 shown and described in connection with FIG. 3E) in the interconnect, for example, in regions that are not as susceptible to short formation (for example, because they are masked and protected by a second ILD layer, for example, a second ILD layer 315 shown and described in connection with FIG. 3F). In one embodiment, the horizontal dimensions of the etched spacer layer 313 may not extend past the outmost edge of the one or more vias 308, unlike what is shown in FIG. 3D. Alternatively or additionally, the horizontal dimensions of the etched spacer layer 313 may extend past the outmost edge of the one or more vias 308, like what is shown in FIG. 3D. These differences may or may not be intentional, and may be the result of inherent misalignments during the course of one or more processing steps. Further, it can be understood that the dimensions of the spacer layer 313 or any other layer in this or any other figure shown herein are not necessarily drawn to scale.

In one embodiment, the interconnect 305 can include a first ILD layer 302. In one embodiment, the first ILD layer 302 may include a permanent and/or a non-conformal layer. The first ILD layer 302 may be deposited using CVD, PECVD, and/or spin coating or any suitable technique. The first ILD layer 302 can have a thickness of approximately 5 nanometers to approximately 1,000 nanometers with a preferred range of approximately 30 nanometers to approximately 60 nanometers thick.

In one embodiment, the interconnect 305 can further include a plurality of interconnect lines 304, which may be similar to, but not identical to, a portion of the first interconnect lines 104 and/or the second interconnect lines 106 of FIG. 1A and/or FIG. 1B.

In one embodiment, the spacer layer 313 can include a metal oxide. The spacer layer 313 may be deposited using any suitable technique, including, but not limited to, CVD, PECVD, and/or ALD. In one embodiment, the etching of the spacer layer 313 can be performed using a dry etch and/or a wet etch. In one embodiment, the etching of the spacer layer 313 can be a directional etch on the spacer layer 313. For example, the directional etching of the spacer layer 313 may be performed in a downward direction with respect to the Z-axis.

In subsequent processing steps, for example in subsequent steps shown and described below in connection with FIGS. 3E-3G, the spacer layer 313 can act or function as a hard mask layer, which may block regions having tight pitch features on the interconnect 305. This may allow other regions of the interconnect 305 to be etched in downstream processing steps while mitigating the likelihood of electrical short formation. As mentioned, the shorts may have a higher risk of formation in an interconnect not having a physical barrier (for example, a first portion 303 of the first ILD layer 302 as shown and discussed in connection with FIG. 3E), at least because adjacent interconnect lines 304 would only have air (or similar medium) between them. This can lead to a situation where during the deposition of the second metal layer (for example, a second metal layer 324 as further shown and described in connection with FIG. 3G), a portion of the second metal layer 324 can electrically connect (that is, short) the adjacent interconnect lines 304. This may even occur subsequent to the deposition of the second metal layer 324, for example, through diffusion mechanisms and metal migration that may cause the adjacent interconnect lines 304 to electrically connect.

Figure 3E:
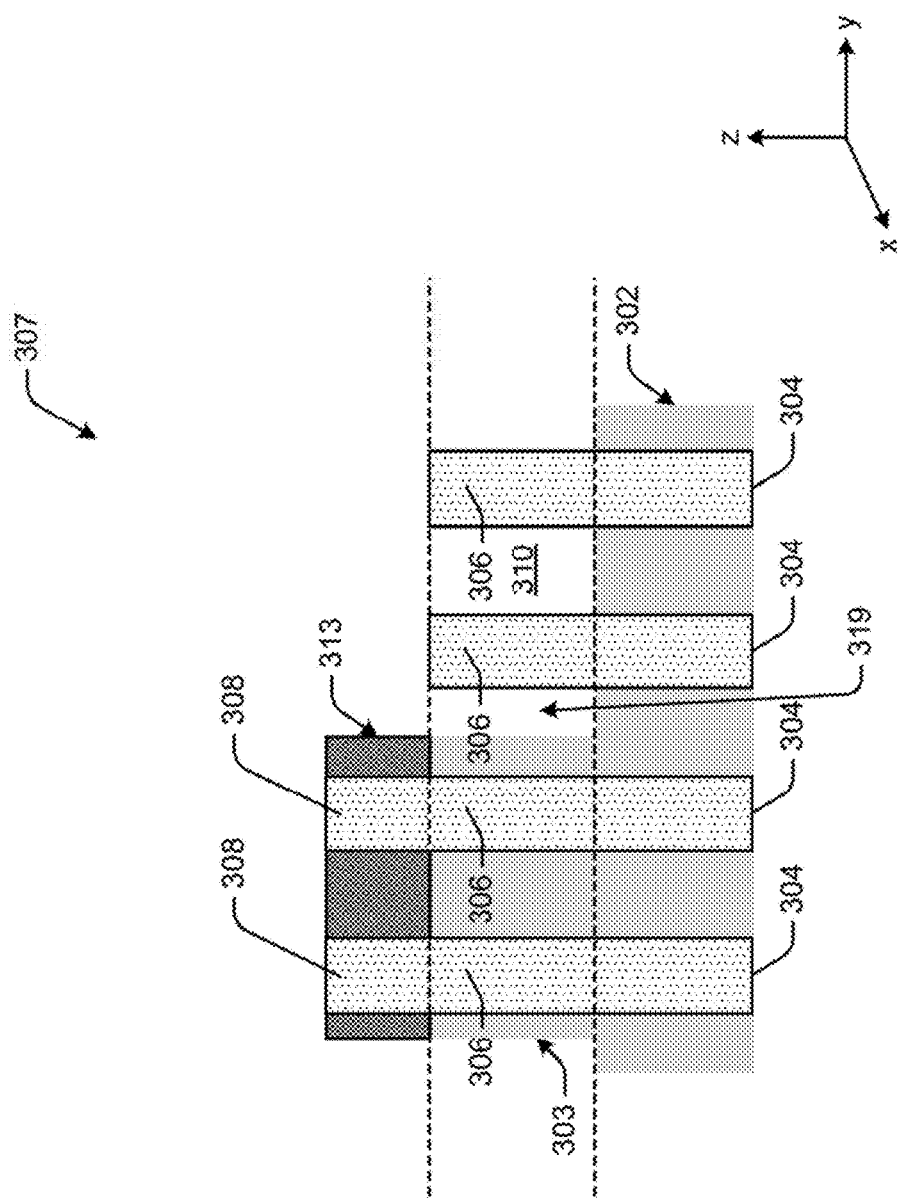

FIG. 3E illustrates an example simplified cross-sectional view of an intermediate structure a processing sequence step for the formation of the interconnect, in accordance with one or more example embodiments of the disclosure. In one embodiment, the interconnect 307 can further include a first portion 303 of the first ILD layer 302, which may be left over after the spacer layer etch, as shown and described in connection with FIG. 3D and relevant description.

In one embodiment, the interconnect 307 may further include a first metal portion of 306, which may include a portion of the plurality of interconnect lines (for example, metal interconnect lines) 304 above the first ILD layer 302 and below the etch spacer layer 313. In particular, the metal interconnect line 304 can include various portions: a portion of the metal interconnect line 304 can be embedded with the first ILD layer 302; a portion of the metal interconnect line can be at least partially embedded in a spacer layer 313; and a portion of metal interconnect line 304 (e.g., the first metal portion 306) can serve to connect the two portions embedded in the first ILD layer 302 and the spacer layer 313. The interconnect 307 may further include one or more vias 308.

Further, in one embodiment, a second etching step can be performed the interconnect 307 on the first ILD layer 302, leaving behind a first portion 303 of the first ILD layer 302. The interconnect 307 can include a first ILD layer 302, which can be partially etched. In one embodiment, the etching of the first ILD layer 302 can further include a dry etch. In another embodiment, the dry etch having different chemical and/or mechanical components. In one embodiment, the etching of the first ILD layer 302 can be selective with respect to the spacer layer 313. That is, the etching of the first ILD layer 302 may not further etch the spacer layer 313. In various embodiments, the etching of the first ILD layer 302 may lead to the initial formation of one or more gaps 310, for example, one or more air gaps. The dimensions (depth and/or width) of the gaps 310 can be dependent on the second etching step. For example, the second etching step may have a duration so that the second etching step may leave a portion of the gap 310 filled with ILD material (not shown). This may or may not be intentional depending on specific processing procedures and tolerances.

Figure 3F:
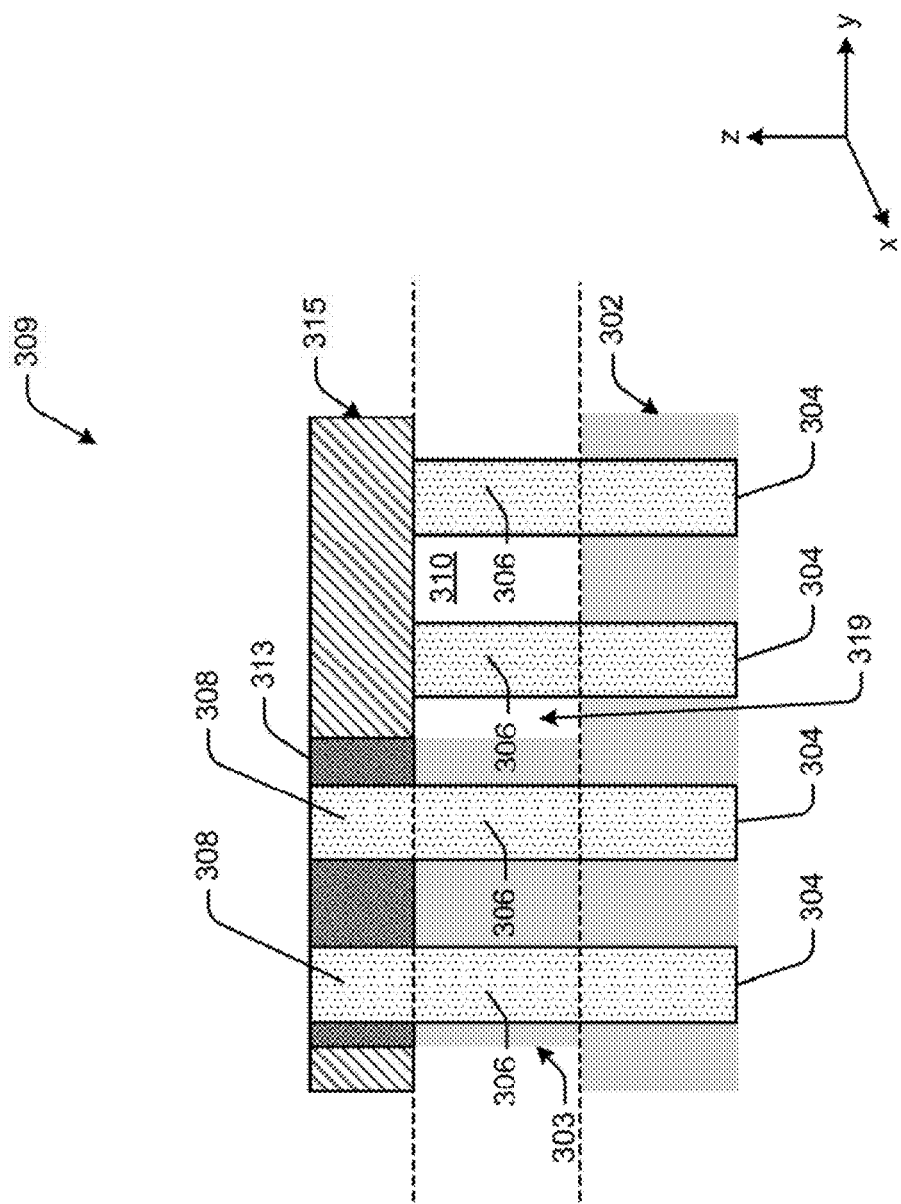

FIG. 3F illustrates an example simplified cross-sectional view of an intermediate structure portion or of a processing sequence for the formation of a portion of the interconnect in accordance with one or more example embodiments of the disclosure. In one embodiment, the interconnect 309 can include a partially etched first ILD layer 302 similar to the first ILD layer 302 of preceding figures. The interconnect 309 can further include a plurality of interconnect lines 304. The plurality of interconnect lines 304 may include metal interconnect lines and may be similar to, but not necessarily identical to, a portion of the first interconnect lines 104 and/or second interconnect lines 106 of FIG. 1B.

In one embodiment, the interconnect 309 can further include a first portion 303 of the first ILD layer 302, which may be left over after the spacer etching step, as shown and described in connection with FIG. 3 and relevant description.

In an embodiment, the interconnect 309 can include a second ILD layer 315, which may be backfilled in various embodiments. In another embodiment, the second ILD layer 315 may be non-conformal. In an embodiment, the second ILD layer 315 may be disposed or deposited via a filling step and a polishing step (not shown).

In an embodiment, the formation of the second ILD layer 315 may lead to the formation of one or more gaps 310 and/or one or more partially filled gaps 319. In various embodiments, the dimensions (depth and/or width) of the gaps 310 and/or the partially filled gaps 319 can be dependent on the second etching step and/or the dimensions of the spacer layer 313 and other processing factors. For example, the second etching step may have had a duration so that the second etching step may leave a portion of the gaps 310 and/or the partially filled gaps 319 filled with ILD material (not shown). This may or may not be intentional depending on specific processing procedures and tolerances. In one embodiment, the gap(s) 310 and/or the partially filled gap(s) 319 may include air or any other suitable gas, liquid, or dielectric material. In an embodiment, the gap(s) 310 and/or the partially filled gap(s) 319 may include a lower K dielectric with respect to neighboring ILD layers (for example, first ILD layer 302 and/or a second ILD layer 315).

In various embodiments, the gap (for example, the gap 310 and/or the partially filled gap 319) of the interconnect 309 may be self-aligned to have a predetermined offset from one or more vias 308, for example, without the need for additional masking steps. In an embodiment the dimensions of the partially filled gap 319 may be based on the spacer layer 313 dimensions (as shown and discussed in connection with FIG. 3D), as during the formation of the gaps 310, the region underlying the spacer layer 313 may be partially blocked by the spacer layer 313, preventing the removal of portions 303 of the first ILD layer 302, which may include, for instance, the portion between the interconnect lines 304 aligned with the vias 308, and portion of the ILD 302 adjacent to said interconnect lines.

Figure 3G:
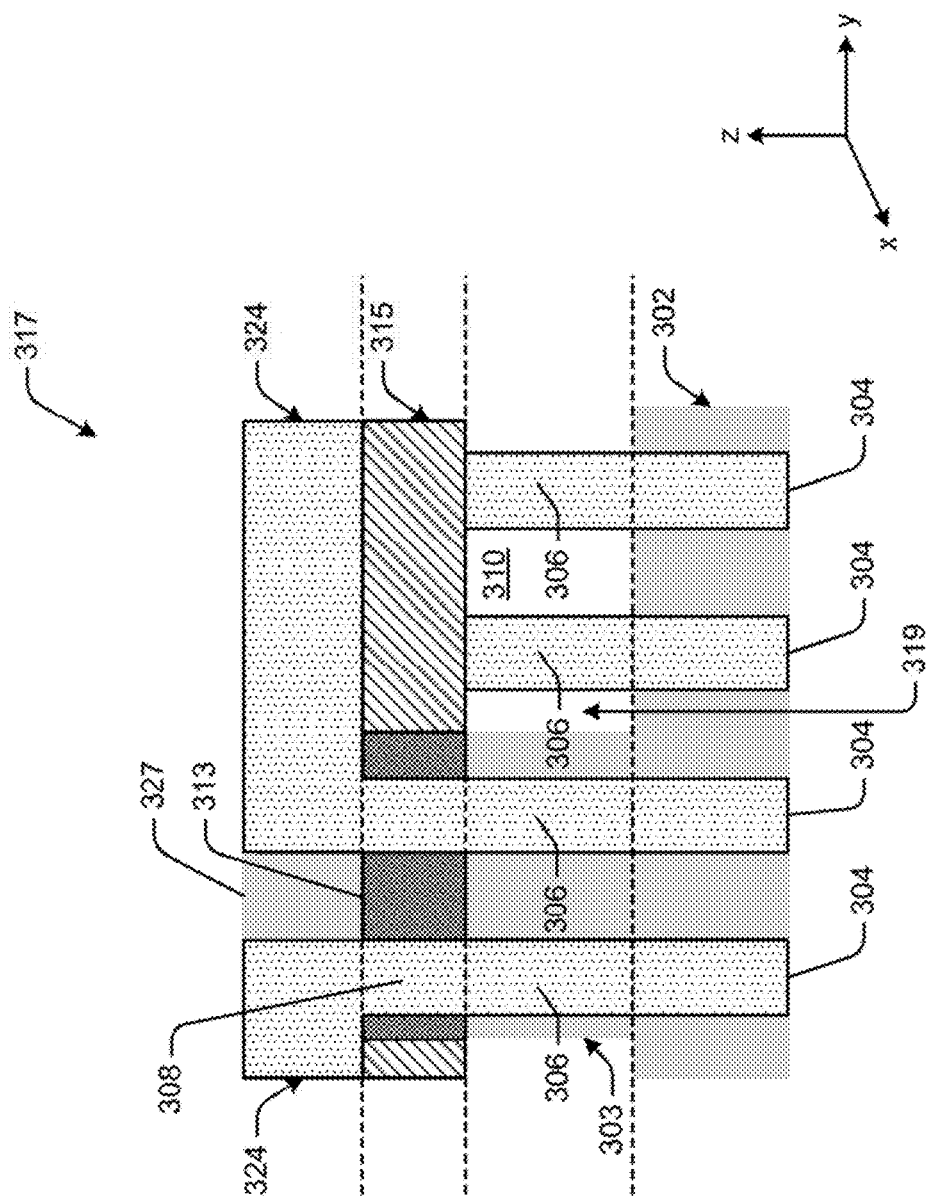

FIG. 3G illustrates an example simplified cross-sectional view of an intermediate structure a processing sequence for the formation of the interconnect in accordance with one or more example embodiments of the disclosure.

In one embodiment, the interconnect 317 may include a first ILD layer 302. The interconnect 317 may further include a plurality of interconnect lines 304. The plurality of interconnect lines 304 may, in an embodiment, comprise metal interconnect lines, which may be similar to a portion of the first interconnect line 104 and/or the second interconnect line 106 of FIG. 1B.

In one embodiment, the interconnect 317 may further include a first metal portion 306, which may include a portion of the interconnect line (for example, the metal interconnect line) 304 above the ILD 302 and below the etched spacer layer 313. The interconnect 317 may further include a second ILD layer 315. In an embodiment, the second ILD layer 315 may be backfilled on the interconnect 317. The interconnect 317 may further include one or more vias 308.

In an embodiment, the formation of the second ILD layer 315 may lead to the formation of a gap 310 and/or a partially filled gap 319. In one embodiment, the gap 310 and/or the partially filled gap 319 may include air or any other suitable gas, liquid, or dielectric material. In an embodiment, the gap 310 and/or the partially filled gap 319 may include a lower K dielectric with respect to neighboring ILD layers (for example, first ILD layer 302 and/or a second ILD layer 315).

In various embodiments, the gap (for example, the gap 310 and/or the partially filled gap 319) of the interconnect 317 may be self-aligned to one or more vias 308. In an embodiment the dimensions of the partially filled gap 319 may be based on the spacer dimensions, as during the formation of the gaps 310, the region underlying the spacer layer 313 may be partially blocked by the spacer layer 313.

The interconnect 317 may further include a second metal layer 324, which may be electrically coupled with one or more vias 308. The second metal layer 324 may be deposited on top of the second ILD layer 315 and/or the etched spacer layer 313. In one embodiment, the formation of the second metal layer 324 may be preceded by the patterning of the second ILD layer 315, after which metal may be filled into the patterned second ILD layer 315. Also shown in FIG. 3G is a third ILD 327. The third ILD 327 may be deposited via any suitable mechanism, including but not limited to, chemical vapor deposition (CVD), plasma enhanced chemical vapor deposition (PECVD) and/or by spin coating. The third ILD 327 may be any suitable thickness. For example, the third ILD 327 may be approximately 5 nanometers to approximately 1,000 nanometers thick with a preferred range of approximately 30 nanometers to approximately 60 nanometers thick. In various embodiments, the third ILD 327 may also prevent shorting between adjacent portion of the second metal layer 324.

In one embodiment, the second metal layer 324 may be disposed via any suitable method, including CVD, PVD, electroplating, and/or PECVD. The deposition of the second metal layer 324 may further include an additional step of a deposition of an adhesion layer. The adhesion layer may be any suitable material, including, for example, titanium, tantalum, tungsten, molybdenum, titanium nitride, tantalum nitride, cobalt, cobalt-tungsten-boron, alloys of the aforementioned, combinations thereof, or the like. The deposition of the second metal layer 324 may further include an additional step of a deposition of a metal (for example, a copper layer), which may act as an adhesion promoter, enhance wetting between layers, and/or act as a metal seed layer. The metal seed layer may be deposited by any suitable technique, including but not limited to electroplating. The metal seed layer may be deposited over the adhesion layer, in example embodiments. The metal seed layer may be deposited by any suitable mechanism, such as a sputtering process. The metal seed in some example embodiments may be deposited by PVD, CVD, evaporation, ALD, combinations thereof, or the like. The metal seed layer may be copper, cobalt, aluminum, combinations thereof, or the like.

As described herein, the disclosure may have a number of advantages, for example, including but not limited to: a reduction of mass count, a self-alignment of the air gap mask to the vias, and an increased robustness of mask layer etching. In one embodiment, the reduction of mass count may be accomplished, at least in part, because the gap (for example, air gap) may be formed using existing via topographies and there may be no need for additional masking steps. In one embodiment, the gaps may be formed around via topography and may be inherently self-aligned to the vias, which may allow gaps in tight pitch features of the interconnects. Further, the hard masks can be formed using a spacer layer which is not easily etched, which can make the process robust to next layer processing.

Figure 4:
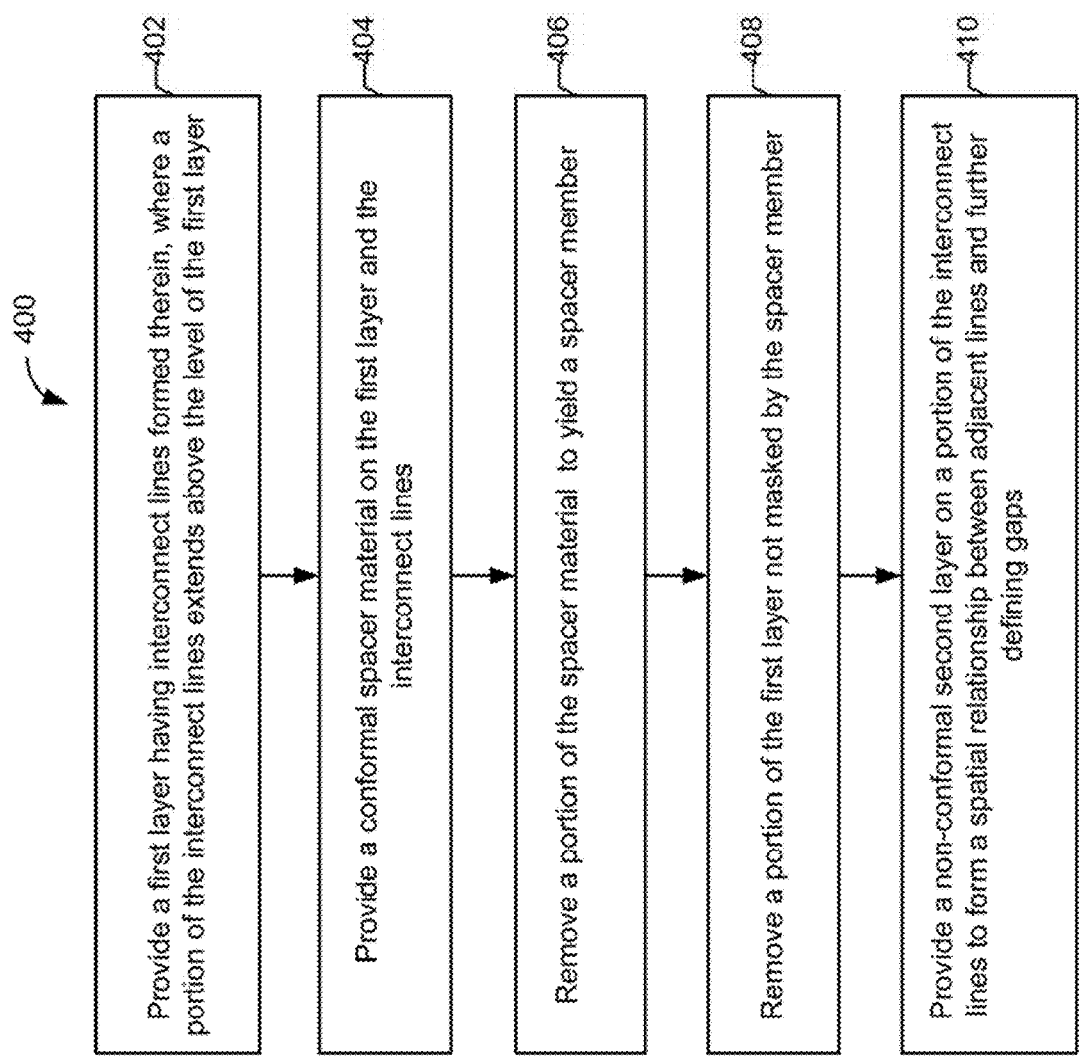
FIG. 4 depicts a flow diagram illustrating an example method for fabricating interconnects in accordance with example embodiments of the disclosure.

FIG. 4 illustrates an example flow chart representing the method and/or process 400 for the fabrication of an interconnect in accordance with example embodiments of the disclosure. This method 400 may be used to fabricate any of the semiconductor packages with passivated interconnects, as depicted in the preceding figures. It will be appreciated that some processes may be performed in an order different from that depicted herein. It will further be appreciated that some processes may have suitable substitutes that may be implemented without deviating from embodiments of the disclosure.

In block 402, a first layer having interconnect lines formed in the first layer can be provided, where a portion of the interconnect lines extends above the level of the first layer and forms vias. In one embodiment, the first layer includes an interlayer dielectric (ILD). In one embodiment, the first ILD layer may include a permanent and/or a non-conformal layer. The first ILD layer may be deposited using CVD, PECVD, and/or spin coating or any suitable technique. The first ILD layer can have a thickness of approximately 5 nanometers to approximately 1,000 nanometers with an example range of approximately 30 nanometers to approximately 60 nanometers thick.

In another embodiment, the one or more interconnect lines includes one or more metal interconnect lines. In various embodiments, the one or more interconnect lines can include a metallic, semi-metallic, or intermetallic material. In various embodiments, the one or more interconnect lines can include a metallic material. Non-limiting examples include gold, copper, silver, aluminum, zinc, tin, platinum, and any of the like. Metallic materials may also be any alloys of such materials. In various embodiments, the one or more interconnect lines can include a semi-metallic material. Non-limiting examples include arsenic, antimony, bismuth, α-tin (gray tin) and graphite, and mercury telluride (HgTe). Semi-metallic materials may also be any mixtures of such materials. In various embodiments, the one or more interconnect lines can include an intermetallic material. Non-limiting examples include gold and aluminum intermetallics, copper and tin intermetallics, tin and nickel intermetallics, tin and silver intermetallics, tin and zinc intermetallics, and any of the like. Intermetallic materials may also be any alloys of such materials.

In block 404, a conformal spacer layer on the first layer and the interconnect lines can be provided. In one embodiment, the spacer layer can be non-conductive. In another embodiment, the spacer layer may be permanent (that is, non-sacrificial). In one embodiment, the spacer layer may be etch selective to the first layer, that is the first ILD layer. In an embodiment, the spacer layer may be deposited by CVD, PECVD, atomic layer deposition (ALD), and/or any other suitable technique. In one embodiment, the spacer layer may have a thickness greater than or equal to approximately one half the thickness of the spacing between adjacent interconnect lines of the one or more interconnect lines (for example, one or more metal interconnect lines). In an embodiment, the spacer layer may include a metal oxide. In another embodiment, the spacer layer may be conformal to facilitate deposition around the tight pitch topography of underlying layers.

In block 406, a portion of the spacer layer can be removed to yield a spacer member. In one embodiment, removing a portion of the spacer layer further includes first etching the portion of the spacer layer using a mask. In one embodiment, the etching of the spacer layer can be performed using a dry etch and/or a wet etch. In one embodiment, the etching of the spacer layer can be a directional etch on the spacer layer. For example, the directional etching of the spacer layer may be performed in a downward direction with respect to the Z-axis.

In block 408, a portion of the first layer not masked by the spacer member can be removed. In one embodiment, removing a portion of the first layer not masked by the spacer member further includes maskless etching the portion of the first layer wherein the maskless etching is etch selective with respect to the first etching. Further, the maskless etching step can be performed on the first layer (for example, the first ILD layer), leaving behind a first portion of the first layer. In one embodiment, the etching of the first layer can further include a dry etch. In another embodiment, the dry etch having different chemical and/or mechanical components. In one embodiment, the etching of the first layer can be selective with respect to the spacer layer. That is, the etching of the first layer may not further etch the spacer layer.

In block 410, a non-conformal second layer on a portion of the interconnect lines can be provided to form a spatial relationship between adjacent interconnect lines defining gaps. In one embodiment, the at least one gap includes an air gap. In an embodiment, the second layer can include a second ILD layer, which may be backfilled. In another embodiment, the second layer (for example, the second ILD layer) may be non-conformal. In an embodiment, the second layer (for example, the second ILD layer) may be disposed or deposited via a filling step and a polishing step. In one embodiment, the gap may include air or any other suitable gas, liquid, or dielectric material. In an embodiment, the gap may include a lower K dielectric with respect to neighboring first and/or second layers (for example, first ILD layer and/or a second ILD layer). In various embodiments, the gap of the portion of the interconnect may be self-aligned to one or more vias.

In various embodiments, the interconnects described in the disclosure can be used in connection with backend of interconnect line (BEOL) processing. BEOL can refer to a portion of IC fabrication where individual devices (transistors, capacitors, resistors, etc.) are interconnected with wiring. BEOL can include contacts, insulating layers (dielectrics), metal levels, and bonding sites for chip-to-package connections. In the BEOL part of fabrication stage contacts (pads), interconnect wires, vias and dielectric structures may be formed. For some IC processes, more than 10 metal layers can be added in the BEOL.

In various embodiments, the disclosed interconnects can be used in connection with an electronic component. The electronic components may be any suitable electronic components, including, but not limited to, integrated circuits, surface mount devices, active devices, passive devices, diodes, transistors, connectors, resistors, inductors, capacitors, microelectromechanical systems (MEMSs), combinations thereof, or the like.

In one embodiment, the interconnects may provide electrical pathways for signals between electronic components (for example, integrated circuits, passive devices, etc.), input/output (I/O) connections on the semiconductor package, signal fan out from/to the electronic components, signal connections between two or more electrical components, power delivery to electrical component(s), ground connections to electrical component(s), clock signal delivery to the electrical component(s), combinations thereof, or the like.

In one embodiment, a substrate as referenced herein can refer to a solid (usually planar) substance onto which a layer of another substance is applied, and to which that second substance adheres. The substrate can be a thin slice of material such as silicon, silicon dioxide, aluminum oxide, sapphire, germanium, gallium arsenide (GaAs), an alloy of silicon and germanium, or indium phosphide (InP). These serve as the foundation upon which electronic devices such as transistors, diodes, and especially integrated circuits (ICs) are deposited.

In various embodiments, the plurality of interconnect lines and/or second metal layers can comprise a metallic, semi-metallic, or intermetallic material. In various embodiments, the plurality of interconnect lines and/or second metal layers can comprise a metallic material. Non-limiting examples include gold, copper, silver, aluminum, zinc, tin, platinum, and any of the like. Metallic materials may also be any alloys of such materials.

In various embodiments, the plurality of interconnect lines and/or second metal layers can comprise a semi-metallic material. Non-limiting examples include arsenic, antimony, bismuth, α-tin (gray tin) and graphite, and mercury telluride (HgTe). Semi-metallic materials may also be any mixtures of such materials.

In various embodiments, the plurality of interconnect lines and/or second metal layers can comprise an intermetallic material. Non-limiting examples include gold and aluminum intermetallics, copper and tin intermetallics, tin and nickel intermetallics, tin and silver intermetallics, tin and zinc intermetallics, and any of the like. Intermetallic materials may also be any alloys of such materials.

In various embodiments, the plurality of interconnect lines and/or second metal layers may be deposited by any suitable mechanism including, but not limited to, metal foil lamination, physical vapor deposition, chemical vapor deposition, sputtering, metal paste deposition, combinations thereof, or the like.

In an embodiment, the vias may then be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like.

In some example embodiments, the hard mark layer disclosed herein may include any suitable material, such as silicon nitride, silicon dioxide, silicon oxynitride, silicon carbonitride, silicon carbide, silicon oxycarbonitride, spin-on silicate glass films, polymeric dielectric films, non-stoichiometric variations of the aforementioned films, combinations thereof, or the like. The hard mask layer may be deposited by any suitable mechanism including plasma enhanced chemical vapor deposition (PECVD), chemical vapor deposition (CVD), spin-on processes, spray coating processes, physical vapor deposition (PVD), combinations thereof, or the like. In some example embodiments, the hard mask layer may be a silicon nitride film of a thickness in the range of about 20 nanometers to about 1 micron, such as at a thickness of 200 nm. The silicon nitride hard mask layer may be deposited by a PECVD system, such as with silane/ammonia ($SiH_4/NH_3$) based feed gas in a microwave plasma, such as a downstream plasma system. Alternatively, the silicon nitride hard mask layer may be formed in any suitable plasma CVD system, such as capacitively-coupled plasma, inductively-coupled plasma, high density plasma, magnetically enhanced plasma, etc. In some example embodiments, the hard mask layer may be etched using a permanganate etch solution, a phosphoric acid solution, or indeed any suitable etch for removal of the hard mask layer.

The ILD layers may be of any suitable material properties (for example, k value, leakage properties, etc.) and thicknesses. For example, relatively low-k pre-preg ILD layers may be used to allow for high-frequency, low signal degradation signaling. In example embodiments, ILD layers may include laminate ILD layers with a thickness in the range of about 25 microns (μm) to about 100 μm and metal layers in the range of about 10 μm to about 40 μm.

In some example embodiments, the spacer layers and/or the ILDs may be removed by a plasma etch process, such as a magnetically enhanced reactive ion etch (MERIE), high density plasma (HDP), or indeed any suitable plasma etch process. In some example embodiments, the spacer layers and/or the ILDs may have filler materials, resins, and/or other elements to make the spacer layers and/or the ILDs more resistant to plasma etching. Any suitable type of plasma system may be used including, but not limited to, capacitively-coupled, inductively-coupled, microwave plasma, upstream plasma, combinations thereof, or the like. Any suitable etch gases may be used, for example, fluorinated gases, such as tetrafluoromethane, hexafluoroethane, octafluoropropane, octafluorocyclobutane, herafluoro-1,3-butadiene, combinations thereof, or the like. Additionally, other gases for promoting polymerization and/or etching, as well as carrier gases may be used, such as oxygen, hydrogen, carbon dioxide, nitrogen, argon, helium, combinations thereof, or the like.

In order to fabricate the various build-up (for example, ILD), spacer, and/or metal layers described herein, various fabrication steps can be performed, including steps to deposit/laminate the layers, expose the deposited/laminated layers to radiation, develop layers, cure the layers, and pattern the layers. In one embodiment, processing the build-up (for example, ILD), spacer, and/or metal layers can further include exposing the layers using a mask. The mask can include, for example, a photomask, which can refer to an opaque plate with holes or transparencies that allow light to shine through in a defined pattern. In one embodiment, the photomask can include transparent fused silica blanks covered with a pattern defined with a chrome metal-absorbing film. In another embodiment, the photomask can be used at a predetermined wavelength, including but not be limited to, approximately 436 nm, approximately 365 nm, approximately 248 nm, and approximately 193 nm. In one embodiment, there can be a one-to-one correspondence between the mask pattern and the layer pattern, for example, using one-to-one mask aligners. In other embodiments, steppers and scanners with reduction optics can be used to project and shrink the pattern by four or five times onto the surface of the layers. To achieve complete coverage, the photoimageable dielectric layer is repeatedly "stepped" from position to position under the optical column until full exposure is achieved.

In one embodiment, processing the build-up (for example, ILD), spacer, and/or metal layers can further include developing the layers using an ultraviolet light source. In one embodiment, the light types that can be used to image the layers can include, but not be limited to UV and DUV (Deep UV) with the g and I interconnect lines having wavelength of approximately 436 nm and approximately 365 nm, respectively, of a mercury-vapor lamp. In various embodiments, the development of the layers can include an exposure to the ultraviolet light source for a few seconds through the mask. The areas of the layers which are exposed stay, and the rest of the layers are developed.

In one embodiment, the developing light wavelength parameter can be related to the thickness of the layers, with thinner layers corresponding to shorter wavelengths. This can permit a reduced aspect ratio and a reduced minimum feature size.

In one embodiment, various chemicals may be used for permanently giving the build-up (for example, ILD), spacer, and/or metal layers the desired property variations. The chemicals can include but not be limited to poly(methyl methacrylate) (PMMA), poly(methyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, processing the build-up (for example, ILD), spacer, and/or metal layers can further include curing the layers using a heat source. The heat source can generate heat of a predetermined temperature of approximately 120° C. to approximately 140° C. in approximately 45 minutes. In one embodiment, the heat source can comprise an oven. The oven can have a temperature uniformity of approximately ±0.5% of the predetermined temperature. Moreover, the oven can comprise low particulate environmental controls to protect contamination, for example, using HEPA filtration of the air inside the oven. In one embodiment, the HEPA filter use can produce Class 10 (ISO Class 4) air quality. Moreover, the oven can be configured to have low oxygen levels to prevent oxidation of any of the layers.

In various embodiments, the interconnects, as described herein, may be used in connection with one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (for example, Sandy Bridge®, Ivy Bridge®, Haswell®, Broadwell®, Skylake®, etc.).

Additionally or alternatively, the interconnects, as described herein, may be used in connection with one or more memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the interconnects is used and/or provided may be a computing device. Such a computing device may house one or more boards on which the interconnects may be disposed. The board may include a number of components including, but not limited to, a processor and/or at least one communication chip. The processor may be physically and electrically connected to the board through, for example, electrical connections of the interconnects. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

According to example embodiments of the disclosure, there may be an assembly. The assembly may comprise: a first layer having a first surface and a second surface; interconnect lines having respective proximate ends, respective distal ends, respective first side surfaces, and respective second side surfaces, wherein respective first portions of a first subset of the interconnect lines extend above the first surface of the first layer, the respective first portions including the respective distal ends of the first subset of the interconnect lines, and wherein respective second portions of a second subset of the interconnect lines extend above the second surface of the first layer, the respective second portions including the respective distal ends of the first subset of the interconnect lines; a spacer layer disposed on a second portion of the first layer, the spacer layer abutting a first interconnect line of the second subset of the interconnect lines at a first side surface of the first interconnect line, the spacer layer further abutting a second interconnect line of the second subset of the interconnect lines at a first surface wherein the spacer layer masks the second portion of the first layer; a non-conformal second layer disposed on the distal ends of the first portion of the first subset of interconnect lines extending above the first surface of the first layer, wherein a first portion of the non-conformal second layer, a third portion of the first layer, a first side surface of a first interconnect line of the first subset of the interconnect lines and a first side surface of a second interconnect line of the first subset of the interconnect lines define a gap.

Implementation may include one or more of the following features. The first layer of the assembly may comprise an interlayer dielectric. The interconnect lines may comprise one or more metal interconnect lines which may further comprise copper or aluminum. The gap may comprise any one of an air gap or dielectric material. The non-conformal second layer may comprise an ILD. A second metal layer may be disposed on the non-conformal second layer and the spacer layer, and the second metal layer is electrically and mechanically connected to the respective second portions of the second subset of the interconnect lines that extend above the second surface of the first layer. The spacer layer of the assembly may comprise a metal oxide and the spacer layer may have a thickness about one half the spacing between the first interconnect line of the first subset of the interconnect lines and the second interconnect line of the first subset of the interconnect lines. The non-conformal second layer may have a thickness of about 30 nm to about 60 nm. A second portion of the non-conformal second layer, a fourth portion of the first layer, a second side surface of a first interconnect line of the first subset of the interconnect lines and a first side surface of the second portion of the first layer may define a partial gap.

According to example embodiments of the disclosure, there may be a method. The method may comprise: providing a first layer having a first surface and a second surface; providing interconnect lines having respective proximate ends, respective distal ends, respective first side surfaces, and respective second side surfaces, wherein respective first portions of a first subset of the interconnect lines extend above the first surface of the first layer, the respective first portions including the respective distal ends, and wherein respective second portions of a second subset of the interconnect lines extend above the second surface of the first layer, the respective second portions including the respective distal ends; providing a spacer layer disposed on the first layer and the interconnect lines; removing a portion of the spacer layer to yield a spacer member, the spacer member abutting a first interconnect line of the second subset of the interconnect lines at a first side surface of the first interconnect line, the spacer layer further abutting a second interconnect line of the second subset of the interconnect lines at a first surface, wherein the spacer layer masks a first portion of the first layer; removing a second portion of the first layer not masked by the spacer member; providing a non-conformal second layer disposed on the distal ends of the first portion of the first subset of interconnect lines extending above the first surface of the first layer, wherein a first portion of the non-conformal second layer, a third portion of the first layer, a first side surface of a first interconnect line of the first subset of the interconnect lines and a first side surface of a second interconnect line of the first subset of the interconnect lines define a gap.

Implementation may include one or more of the following features. The method of providing the first layer may comprise providing an interlayer dielectric. Providing the interconnect lines may comprise providing metal interconnect lines, the providing including depositing respective amounts of metal in predetermined locations in the first layer. The method of removing a portion of the spacer layer may further comprise etching the portion of the spacer layer, the etching comprising subjecting the spacer layer to one of a dry etch process or a wet etch process. Removing a second portion of the first layer not masked by the spacer member may further comprise maskless etching the second portion of the first layer, wherein the maskless etching is etch selective with respect to the first etching. The method for providing a spacer layer may further comprise depositing the spacer layer by chemical vapor deposition (CVD), plasma enhanced chemical vapor deposition (PECVD), or spin coating. The method may further comprise providing a hard mask layer disposed on the first layer and the first subset of interconnect lines, abutting a first interconnect line of the second subset of the interconnect lines at a first side surface of the first interconnect line, and abutting a second interconnect line of the second subset of the interconnect lines at a first surface. The method may further comprise providing a second metal layer disposed on the non-conformal second layer and the spacer layer, the second metal layer being electrically and mechanically connected to the respective second portions of the second subset of the interconnect lines that extend above the second surface of the first layer.

According to example embodiments of the disclosure, there may be an electronic device. The electronic device may comprise an assembly which may comprise: a first layer having a first surface and a second surface; interconnect lines having respective proximate ends, respective distal ends, respective first side surfaces, and respective second side surfaces, wherein respective first portions of a first subset of the interconnect lines extend above the first surface of the first layer, the respective first portions including the respective distal ends of the first subset of the interconnect lines, and wherein respective second portions of a second subset of the interconnect lines extend above the second surface of the first layer, the respective second portions including the respective distal ends of the first subset of the interconnect lines; a spacer layer disposed on a second portion of the first layer, the spacer layer abutting a first interconnect line of the second subset of the interconnect lines at a first side surface of the first interconnect line, the spacer layer further abutting a second interconnect line of the second subset of the interconnect lines at a first surface wherein the spacer layer masks the second portion of the first layer; a non-conformal second layer disposed on the distal ends of the first portion of the first subset of interconnect lines extending above the first surface of the first layer, wherein a first portion of the non-conformal second layer, a third portion of the first layer, a first side surface of a first interconnect line of the first subset of the interconnect lines and a first side surface of a second interconnect line of the first subset of the interconnect lines define a gap.

Implementation may include one or more of the following features. The first layer of the electronic device which may comprise an assembly may comprise an interlayer dielectric. The interconnect lines may comprise one or more metal interconnect lines which may further comprise copper or aluminum. The gap may comprise any one of an air gap or dielectric material. The non-conformal second layer may comprise an ILD. A second metal layer may be disposed on the non-conformal second layer and the spacer layer, and the second metal layer is electrically and mechanically connected to the respective second portions of the second subset of the interconnect lines that extend above the second surface of the first layer. The spacer layer of the assembly may comprise a metal oxide and the spacer layer may have a thickness about one half the spacing between the first interconnect line of the first subset of the interconnect lines and the second interconnect line of the first subset of the interconnect lines. The non-conformal second layer may have a thickness of about 30 nm to about 60 nm. A second portion of the non-conformal second layer, a fourth portion of the first layer, a second side surface of a first interconnect line of the first subset of the interconnect lines and a first side surface of the second portion of the first layer may define a partial gap.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices or systems and performing any incorporated methods and processes. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An integrated circuit (IC) structure, comprising:
   a plurality of interconnect lines;
   a via over, and in contact with, one of the interconnect lines;
   a metal layer over, and in contact with, the via;
   a dielectric spacer laterally adjacent to the via;
   a dielectric material between ones of the interconnect lines within a first region that is below the dielectric spacer, wherein the dielectric material is in contact with the dielectric spacer; and
   a gap comprising air or other gas, the gap within a same plane as, and a portion of the air or other gas of the gap in direct contact with, the dielectric material and between ones of the interconnect lines within a second region that is immediately laterally adjacent to the first region and not below the dielectric spacer.

2. The IC structure of claim 1, wherein the dielectric material is in contact with the ones of the interconnect lines within the first region.

3. The IC structure of claim 1, wherein the dielectric spacer is the only material between the via and a second via, adjacent to the first via, and wherein the dielectric material directly below the dielectric spacer occupies all space between adjacent ones of the first interconnect lines.

4. The IC structure of claim 1, further comprising a non-conformal dielectric material laterally adjacent to, and in contact with, the dielectric spacer, wherein the non-conformal dielectric material extends over the gap, and a top surface of the dielectric spacer is coplanar with a top surface of the non-conformal dielectric material.

5. The IC structure of claim 4, wherein the metal layer is over, and in contact with, the top surface of the dielectric spacer and the top surface of the non-conformal dielectric material.

6. The IC structure of claim 5, wherein the non-conformal dielectric layer has a thickness of 30 nm to 60 nm.

7. The IC structure of claim 1, wherein the dielectric spacer comprises a metal oxide.

8. The IC structure of claim 1, wherein the dielectric material is in contact with the ones of the interconnect lines within the first region.

9. A method of fabricating an integrated circuit (IC) structure, the method comprising:
   forming an interconnect via over, and in contact with, one of a plurality of interconnect lines within a first dielectric material;
   forming a dielectric spacer laterally adjacent to the interconnect via;
   forming a gap comprising air or another gas between two or more of the interconnect lines by removing a portion of the first dielectric material not masked by the dielectric spacer;
   non-conformally depositing a second dielectric material over the interconnect lines, and over the gap;
   polishing a top surface of the second dielectric to be coplanar with a top surface of the interconnect via and with a top surface of the dielectric spacer; and depositing a metal layer over, and in contact with, the interconnect via.

10. The method of claim 9, wherein depositing the metal layer places the metal in contact with the top surface of the second dielectric and in contact with the top surface of the dielectric spacer.

11. The method of claim 9, wherein forming the dielectric spacer further comprises:
- depositing a conformal dielectric layer over, and in contact with, the interconnect via and over the first dielectric material; and
- etching the conformal dielectric layer with a directional etch to remove the spacer from over the first dielectric material.

12. The method of claim 9, wherein removing the portion of the first dielectric material not masked by the dielectric spacer further comprises etching the first dielectric material selectively to the dielectric spacer.

13. The method of claim 9, wherein forming the interconnect via further comprises:
- forming a hardmask layer over the interconnect lines;
- forming the interconnect via within the hardmask layer; and
- removing the hardmask layer before forming a dielectric spacer.

14. The method of claim 9, wherein depositing the metal layer further comprises depositing the metal layer within a patterned dielectric material.

* * * * *